(12) United States Patent
Lim et al.

(10) Patent No.: US 10,692,566 B2
(45) Date of Patent: Jun. 23, 2020

(54) INTERFACE METHOD OF MEMORY SYSTEM, INTERFACE CIRCUITRY AND MEMORY MODULE

(71) Applicant: Samsung Electronics Co., Ltd., Suwon-si (KR)

(72) Inventors: Sun-Young Lim, Hwaseong-si (KR); In-Su Choi, Hwaseong-si (KR); Dimin Niu, Sunnyvale, CA (US); In-Dong Kim, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 178 days.

(21) Appl. No.: 15/812,497

(22) Filed: Nov. 14, 2017

(65) Prior Publication Data

US 2018/0144786 A1   May 24, 2018

Related U.S. Application Data

(60) Provisional application No. 62/424,058, filed on Nov. 18, 2016.

(30) Foreign Application Priority Data

Sep. 6, 2017   (KR) .......................... 10-2017-0114016

(51) Int. Cl.
| | | |
|---|---|---|
| G06F 11/10 | (2006.01) | |
| G11C 11/4096 | (2006.01) | |
| G11C 7/10 | (2006.01) | |
| G11C 29/02 | (2006.01) | |
| G06F 11/20 | (2006.01) | |
| G11C 29/52 | (2006.01) | |
| G11C 5/04 | (2006.01) | |
| G11C 29/04 | (2006.01) | |

(52) U.S. Cl.
CPC ...... *G11C 11/4096* (2013.01); *G06F 11/1048* (2013.01); *G06F 11/1068* (2013.01);
(Continued)

(58) Field of Classification Search
CPC ............. G06F 11/1469; G06F 11/1048; G06F 11/2007; G06F 11/201; G11C 7/1087; G11C 7/1093
See application file for complete search history.

(56) References Cited

U.S. PATENT DOCUMENTS

| | | |
|---|---|---|
| 6,459,651 B1 | 10/2002 | Lee et al. |
| 8,385,142 B1 | 2/2013 | Lin et al. |

(Continued)

OTHER PUBLICATIONS

Cosoroaba et al., "High Performance DDR4 interfaces with FPGA Flexibility", Xilinx, 2014.

*Primary Examiner* — Yolanda L Wilson
(74) *Attorney, Agent, or Firm* — Muir Patent Law, PLLC

(57) ABSTRACT

A memory system may comprise a plurality of data strobe transfer paths assigned to a plurality of data transfer paths such that each of the plurality of data strobe transfer paths may be shared by the plurality of data transfer paths. At least one selected data strobe transfer path is selected and data signals transferred through the plurality of data transfer paths are sampled using at least one data strobe signal transferred through the selected data strobe transfer path. Reliability of data communication is enhanced through a redundant data strobe scheme by assigning a plurality of data strobe transfer paths to a plurality of data transfer paths such that the plurality of data strobe transfer paths may be shared by the plurality of data transfer paths.

20 Claims, 20 Drawing Sheets

(52) U.S. Cl.
CPC ........ *G06F 11/2094* (2013.01); *G11C 7/1066* (2013.01); *G11C 7/1087* (2013.01); *G11C 7/1093* (2013.01); *G11C 29/023* (2013.01); *G11C 29/028* (2013.01); *G11C 29/52* (2013.01); *G06F 2201/805* (2013.01); *G06F 2201/82* (2013.01); *G11C 5/04* (2013.01); *G11C 2029/0411* (2013.01)

(56) References Cited

U.S. PATENT DOCUMENTS

| | | |
|---|---|---|
| 9,158,873 B1 | 10/2015 | Chong et al. |
| 9,368,174 B2 | 6/2016 | Nishio |
| 9,390,777 B2 | 7/2016 | Kizer et al. |
| 9,450,614 B2 | 9/2016 | Ware et al. |
| 2003/0035400 A1* | 2/2003 | Adler .................... G11C 29/56 370/338 |
| 2006/0262586 A1* | 11/2006 | Solomon ............. G06F 12/0207 365/63 |
| 2012/0047411 A1* | 2/2012 | Lai .................. G01R 31/31937 714/721 |
| 2012/0260016 A1* | 10/2012 | Dreps .................. G06F 13/385 710/305 |
| 2013/0294176 A1* | 11/2013 | Nishio ..................... G11C 8/18 365/189.05 |
| 2015/0309529 A1 | 10/2015 | Woo et al. |
| 2015/0377967 A1* | 12/2015 | Thiruvengadam .......................... G01R 31/31715 714/731 |

* cited by examiner

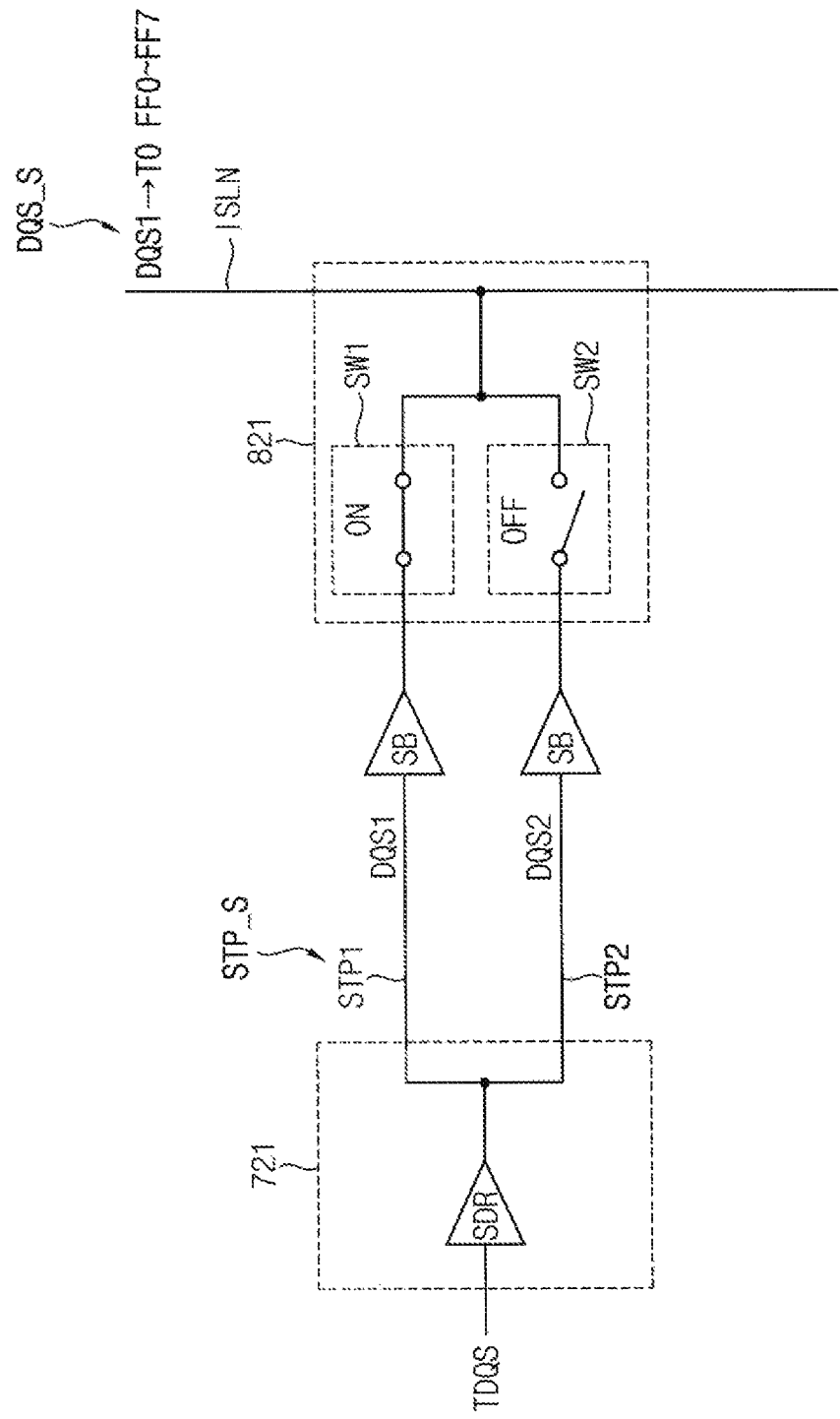

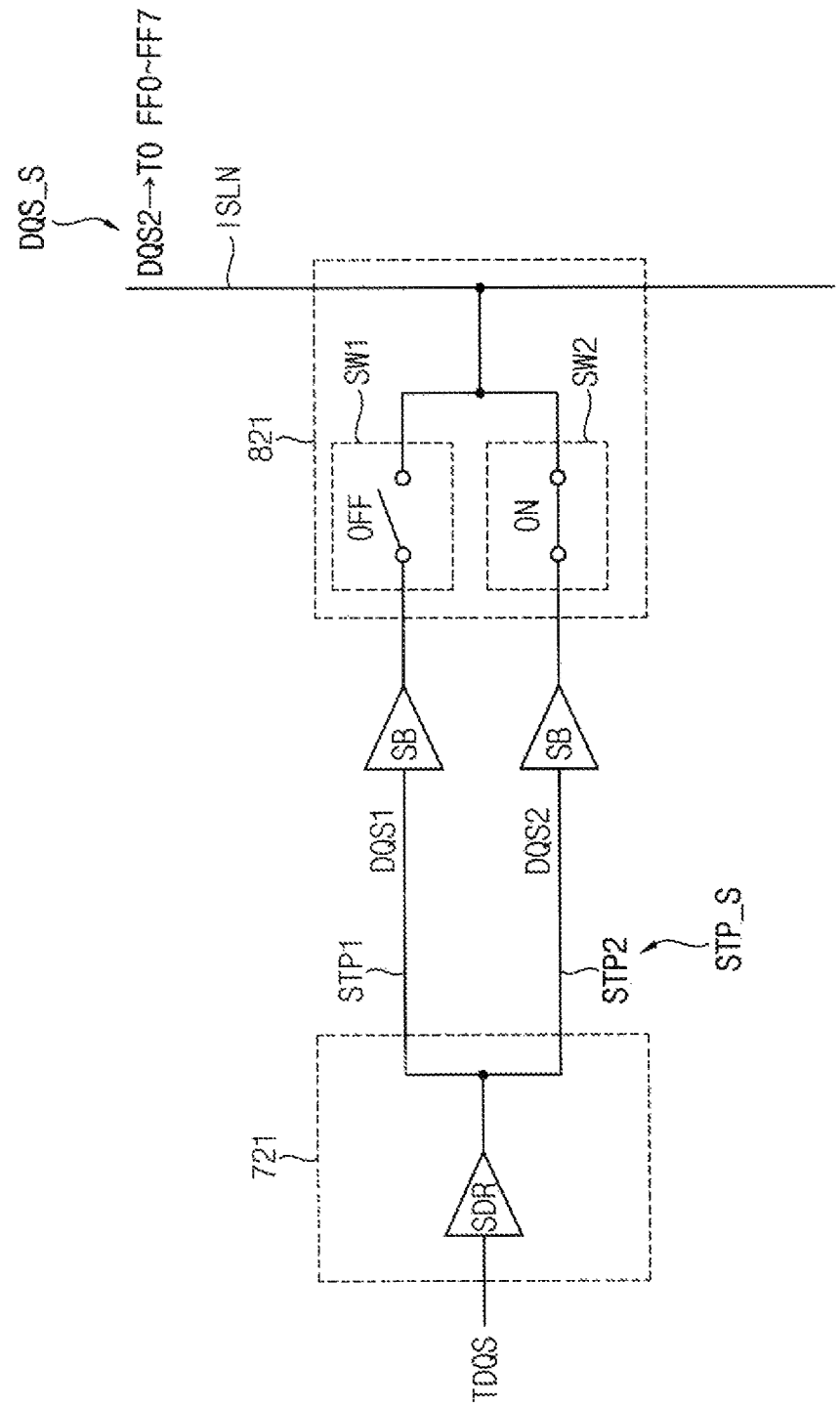

INTERFACE METHOD OF MEMORY SYSTEM, INTERFACE CIRCUITRY AND MEMORY MODULE

CROSS-REFERENCE TO RELATED APPLICATION

This U.S. Non-provisional application claims priority under 35 USC § 119 to Provisional Application No. 62/424,058, filed Nov. 18, 2016, and Korean Patent Application No. 10-2017-0114016, filed Sep. 6, 2017, the disclosures of each of which are incorporated by reference in their entireties herein.

BACKGROUND

1. Technical Field

Example embodiments relate generally to semiconductor integrated circuits, and more particularly to an interface methods, devices and systems to provide communications between semiconductor devices, such as with respect to memory semiconductor devices.

2. Discussion of the Related Art

Semiconductor memory devices for storing data may be classified into volatile memory devices and non-volatile memory devices. Volatile memory devices, such as dynamic random access memory (DRAM) devices (which typically store data by charging or discharging capacitors in memory cells), lose stored data when power is turned off. Non-volatile memory devices, such as flash memory devices, maintain stored data even though power is off. Such memory devices are widely used as main memories of various apparatuses, for storing program codes and/or data in various electronic devices, such as computers, mobile devices, etc.

Memory capacity of semiconductor memory devices is increasing according to developments in manufacturing processes. Further, data transfer rates between a memory device and a memory controller are increasing. To support efficient data transfer between the memory device and the memory controller, data strobe signals are often used to provide timing of when to latch data signals. When some of data transfer paths fail, errors in the transferred data may be corrected by error check and correction (ECC) schemes. However, when data strobe paths fail, resulting errors are typically uncorrectable.

SUMMARY

Some example embodiments may provide an interface method of a memory system capable of enhancing reliability of data communication.

Some example embodiments may provide interface circuitry of a memory system capable of enhancing reliability of data communication.

Some example embodiments may provide a memory module capable of enhancing reliability of data communication.

In an interface method of a memory system according to example embodiments, a plurality of data strobe transfer paths are assigned to a plurality of data transfer paths such that the plurality of data strobe transfer paths may be shared by the plurality of data transfer paths. At least one selected data strobe transfer path is selected from the plurality of data strobe transfer paths. A plurality of data signals transferred through the plurality of data transfer paths are sampled using at least one selected data strobe signal transferred through the selected data strobe transfer path(s).

According to example embodiments, interface circuitry of a memory system includes a plurality of data transfer paths, a plurality of data strobe transfer paths shared by the plurality of data transfer paths, a strobe selection circuit and a plurality of latch circuits. The strobe selection circuit selects at least one selected data strobe transfer path among the plurality of data strobe transfer paths to provide at least one data strobe signal to be transferred through the at least one data strobe transfer path. The plurality of latch circuits sample a plurality of data signals transferred through the plurality of data transfer paths using the at least one selected data strobe signal.

According to example embodiments, a memory module includes a module substrate, a plurality of memory chips mounted on the module substrate and a plurality of data input-output unit circuits configured to perform data transfer between the plurality of memory chips and an external device. Each input-output unit circuit includes a strobe selection circuit configured to select at least one of the data strobe transfer paths to provide at least one data strobe signal transferred through the selected at least one data strobe transfer path and a plurality of latch circuits configured to sample a plurality of transferred data signals using the transferred at least one data strobe signal.

The interface method, the interface circuitry and the memory module according to example embodiments may enhance reliability of data communication through redundant data strobe scheme by assigning a plurality of data strobe transfer paths to a plurality of data transfer paths such that each of the plurality of data strobe transfer paths may be assigned to and shared by the plurality of data transfer paths.

BRIEF DESCRIPTION OF THE DRAWINGS

Example embodiments of the present disclosure will be more clearly understood from the following detailed description taken in conjunction with the accompanying drawings.

FIGS. 6A and 6B are diagrams for describing the example embodiment of FIG. 5.

DETAILED DESCRIPTION OF THE EMBODIMENTS

Figure 1:
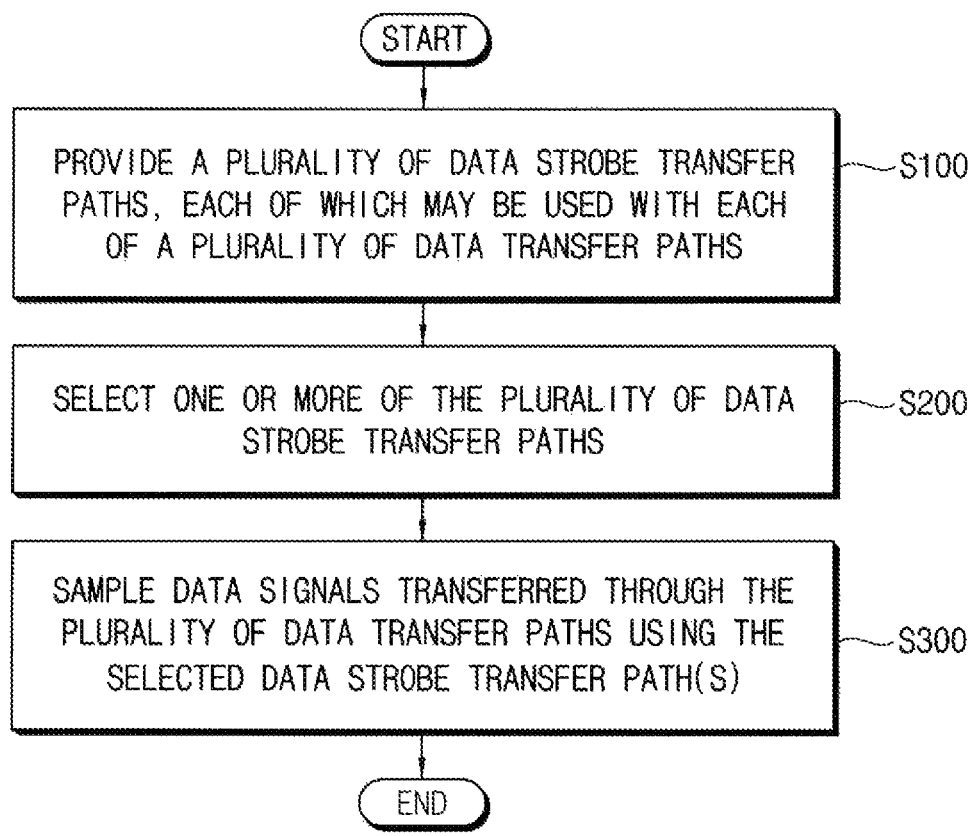
FIG. 1 is a flow chart illustrating an interface method according to example embodiments.

Various example embodiments will be described more fully hereinafter with reference to the accompanying drawings, in which some example embodiments are shown. In the drawings, like numerals refer to like elements throughout. Repetitive descriptions of like elements and operations may be omitted.

FIG. 1 is a flow chart illustrating an interface method according to example embodiments, and more particularly relating to a data communication method between a memory device and a memory controller of a memory system.

Referring to FIG. 1, a plurality of data strobe transfer paths are provided, each of which may be used with a plurality of data transfer paths. Each of the plurality of data strobe transfer paths may be used each of the plurality of data transfer paths (S100). For example, the plurality of data transfer paths may share the plurality of data strobe transfer paths and/or share a selected subset (e.g., one) of the plurality of data strobe transfer paths. At least one data strobe transfer path is selected among the plurality of data strobe transfer paths (S200). A plurality of data signals are transferred through the plurality of data transfer paths and are sampled using the at least one selected data strobe signal transferred through the selected data strobe transfer path (S300).

When one of the plurality of data strobe transfer paths is determined to have failed, another data strobe transfer path among the remaining plurality of data strobe transfer paths may be selected to replace the failed data strobe transfer path. Failure of a data strobe transfer path may include a data bit error amount (or rate) above a certain level when using the data strobe path to transfer data In a typical data interface scheme in a memory system, one data strobe transfer path is dedicated to a plurality of data transfer paths. For example, a data strobe transfer path may be dedicated to be used with four or eight data transfer paths. In these cases, if the dedicated data strobe transfer path fails, data transfer may be impossible and/or the probability of correcting transferred data by conventional error correction may be reduced significantly.

In contrast, in an interface method of a memory system according to example embodiments, reliability of data communication may be enhanced through the redundant data strobe scheme by assigning a plurality of data strobe transfer paths to a plurality of data transfer paths such that the plurality of data strobe transfer paths may be shared by the plurality of data transfer paths.

Figure 2:
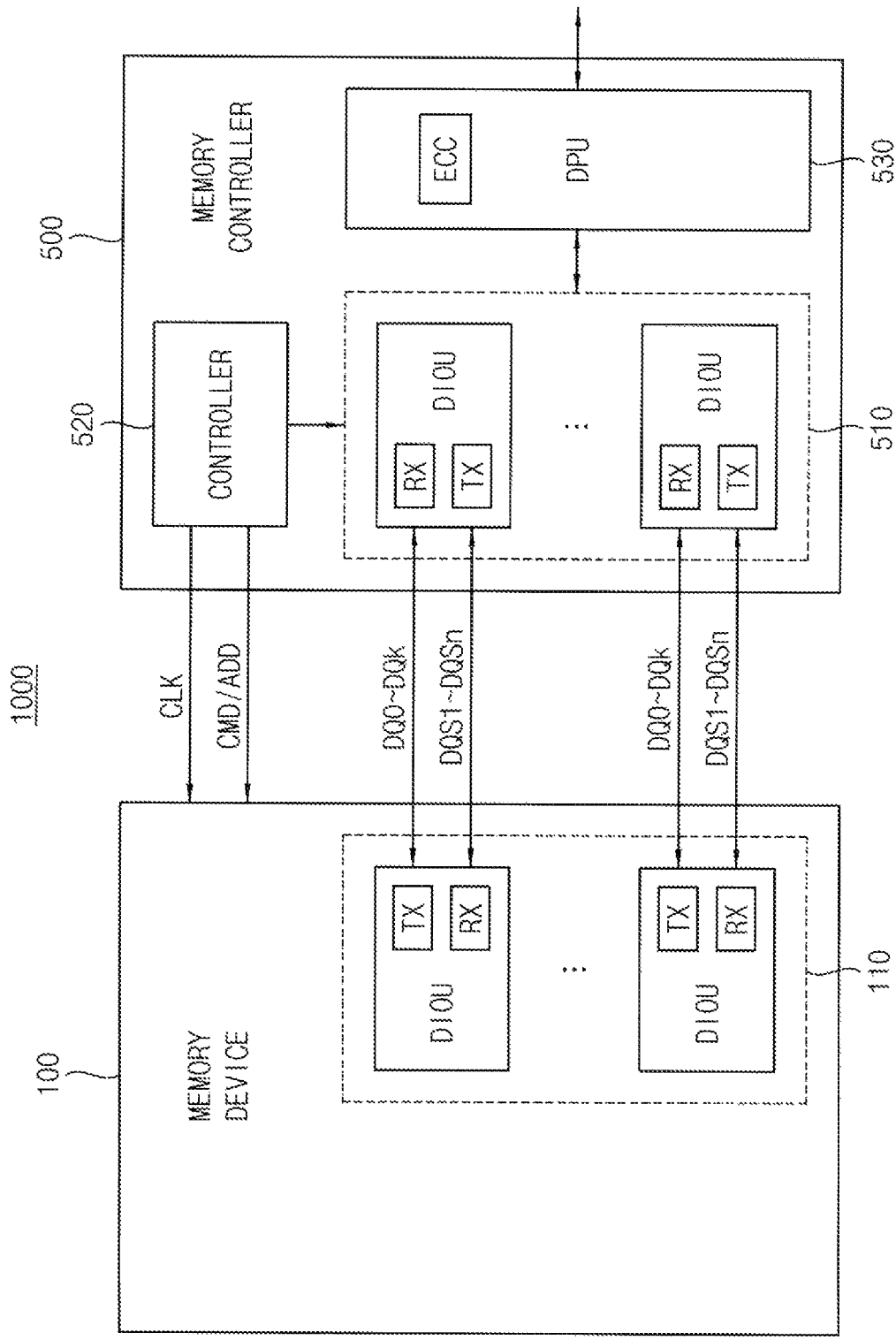
FIG. 2 is a block diagram illustrating a memory system according to example embodiments.

FIG. 2 is a block diagram illustrating a memory system according to example embodiments.

Referring to FIG. 2, a memory system 1000 may include a memory device 100 and a memory controller 500.

The memory device 100 may be a single memory chip, an embedded memory device integrated in a system (e.g., system on a chip, or SoC), a memory module including a plurality of memory chips, for example. The memory controller 500 may be connected to the memory device 100 through a data bus for exchanging data signals DQ0~DQk and data strobe signals DQS1~DQSn, and a control bus for providing signals such as a clock signal CLK, a command signal CMD and an address signal ADD to control data access operations of the memory device 100, such as a data read operation, a data write operation, for example. The memory controller 500 may be connected to a host computer, a processor such as a central processing unit (CPU), or the memory controller 500 may be implemented as a portion of the processor.

The memory device 100 includes a data input-output interface circuit 110, and the data input-output interface circuit 110 may include one or more data input-output unit circuits DIOU. The data input-output unit circuits may have the same configuration. For convenience of illustration, a memory core including memory cells, a control interface portion for receiving the signals CLK, CMD and ADD are omitted in FIG. 2. However, it will be understood that data transmitted between the memory device 100 and memory controller 500 may be stored and retrieved from the memory cells of the memory core in response to command CMD and address signals ADD provided to the control interface portion of the memory device 100.

The memory controller 500 may include a data input-output interface circuit 510, a controller 520 and a data processing unit DPU 530 (e.g., a data processor). The data input-output interface circuit 510 may include one or more data input-output unit circuits DIOU corresponding to those of memory device 100. The controller 520 may generate control signals including the clock signal CLK, the command signal CMD and the address signal ADD and provide the control signals to the memory device 100. The data processing unit 530 may provide data from the data input-output interface circuit 510 to an external device (external to the memory controller 500) such as a host (e.g., host computer) or some a processor in a computer system and provide data from the external device to the data input-output interface circuit 510 for transmission and storage in the memory device 100.

The data processing unit 530 may include an error check and correction (ECC) engine. The ECC engine in this embodiment is a circuit of the memory controller 500 (e.g., forming a portion of the integrated circuit forming the memory controller 500) and may include an ECC encoder and an ECC decoder to check and correct error bits. The ECC engine may perform ECC operations on data to be stored in memory device 100 and retrieved from memory device 100. For example, when a page of data that may be read or written at the same time has a size of 8 KB though 64 KB, portions of the page of data in data unit having sizes of 1 KB through 4 KB (which may be referenced as an ECC sector) may each be processed by the ECC engine to generate a corresponding ECC codeword (for storing in the memory device 100 with the data unit and/or page of data and for performing error detection and correction upon retrieval of the data unit and/or page of data from the memory device 100).

The ECC encoder may perform error correction encoding of the data to be provided to the memory device 100 to generate an ECC codeword comprising a plurality of parity bits. The codeword may be transferred to and stored in the memory device 100. The ECC encoder may perform the encoding on each of the data units. The ECC decoder may perform error detection and correction on the data read out from the memory device 100. If a correctable error is detected, the ECC decoder may correct the error bits of the data using the ECC codeword. If the number of erroneous bits of the data exceeds a threshold number (the correctable bit number), the ECC decoder cannot correct the error bits and the error correction is determined to have failed. The correctable bit number may be the maximum number of bits the ECC engine can correct and is a function of the encoding scheme (e.g., some codewords may allow for identifying and correcting up to two erroneous bits in the read data, while longer codewords may allow for identifying and correcting up to three erroneous bits in the read data).

The ECC encoder and the ECC decoder may check and correct bit errors using encoding schemes such as low density parity check (LPC) code, Bose, Chaudhuri, Hocquenghem (BCH) code, turbo code, Reed-Solomon code (RSC), convolution code, recursive systematic code, trellis-coded modulation (TCM), block coded modulation (BCM), etc. ECC engines, including an ECC encoder and an ECC decoder as described herein, may be disposed redundantly in the memory device 100 in addition to the memory controller 500.

Each data input-output unit circuit DIOU of the memory device 100 may be connected to the corresponding data input-output unit circuit DIOU of the memory controller 500 through a plurality of transfer paths. Each data input-output unit circuit DIOU of the memory device 100 and the memory controller 500 may include a transmission interface circuit TX and a reception interface circuit RX to perform bi-directional data communication.

According to example embodiments, a plurality of data strobe transfer paths (a plurality of conductive wires) for transferring a plurality of data strobe signals DQS1~DQSn are assigned to and shared by a plurality of data transfer paths (e.g., a data bus comprising a plurality of conductive wires) for transferring a plurality of data signals DQ0~DQk. Through such redundant data strobe scheme, reliability of data communication may be enhanced in the memory system 1000.

For ease of description, following details are described with respect to data communication between a transmission interface circuit TX included in one data input-output unit circuit DIOU of a transmitting device and a reception interface circuit RX of another data input-output unit circuit DIOU of a receiving device. As shown in FIG. 2, it will be understood that both of these data input-output unit circuits DIOU in the transmitting device and in the receiving device may comprise both a transmission interface circuit TX and a reception interface circuit RX (although only one of these is shown). When bi-directional data transfer is performed over the same data transfer path (e.g., the same data bus), data transfer in one direction data transfer in the other direction are typically performed sequentially (that is, not at the same time over the same data transfer path). Thus, in this exemplary embodiment, in the data input-output unit circuit of the transmitting device (e.g., one of the memory device 100 and memory controller 500), only the transmission interface circuit TX may be operable (with the reception interface circuit RX (not shown in FIG. 3) of such data input-output circuit of the transmitting device not being used during this transmitting operation). Similarly, in this exemplary embodiment, in the data input-output unit circuit of the receiving device (e.g., the other of the memory device 100 and memory controller 500), only the receiving interface circuit RX may be operable (with the transmission interface circuit TX—not shown in FIG. 3—of such data input-output circuit of the receiving device not being used during this receiving operation). Thus, the exemplary details of both of the transmission interface circuit TX and the reception interface circuit RX are applicable to both devices exchanging data (e.g., applicable to each TX and RX of each DIOU of FIG. 2). For example, with respect to the arrangement of FIG. 2, the details of the transmission interface circuit TX and its operation are generically applicable to the transmission interface circuits TX of the memory device 100 (when transmitting data to the memory controller 500) and to the transmission interface circuits TX of the memory controller 500 (when transmitting data to the memory device 100). Similarly, the details of the reception interface circuit RX and its operation as described herein are applicable to the reception interface circuits RX of the memory device 100 (when receiving data from the memory controller 500) and to the reception interface circuits RX of the memory controller 500 (when receiving data from the memory device 100). Thus, bi-directional data communication may be implemented between the memory device 100 and memory controller 500 using the same data transfer paths DTP0 to DTPk (or a data bus comprising conductive wiring) connecting the devices (e.g., memory device 100 and memory controller 500) to transmit data signals DQ0~DQk therebetween and the same data strobe transfer paths (STP1 to STPn (additional conductive wiring) connected between the devices and to transmit one or more of data strobe signals DQS1~DQSn therebetween. In addition, although some of the following details refer to only two data strobe transfer paths STP1 and STP2 that are assigned to and shared by eight data transfer paths DTP0~DTP7, it will be understood that the number of the data strobe transfer paths and the number of data transfer paths may vary depending on the design.

Figure 3:
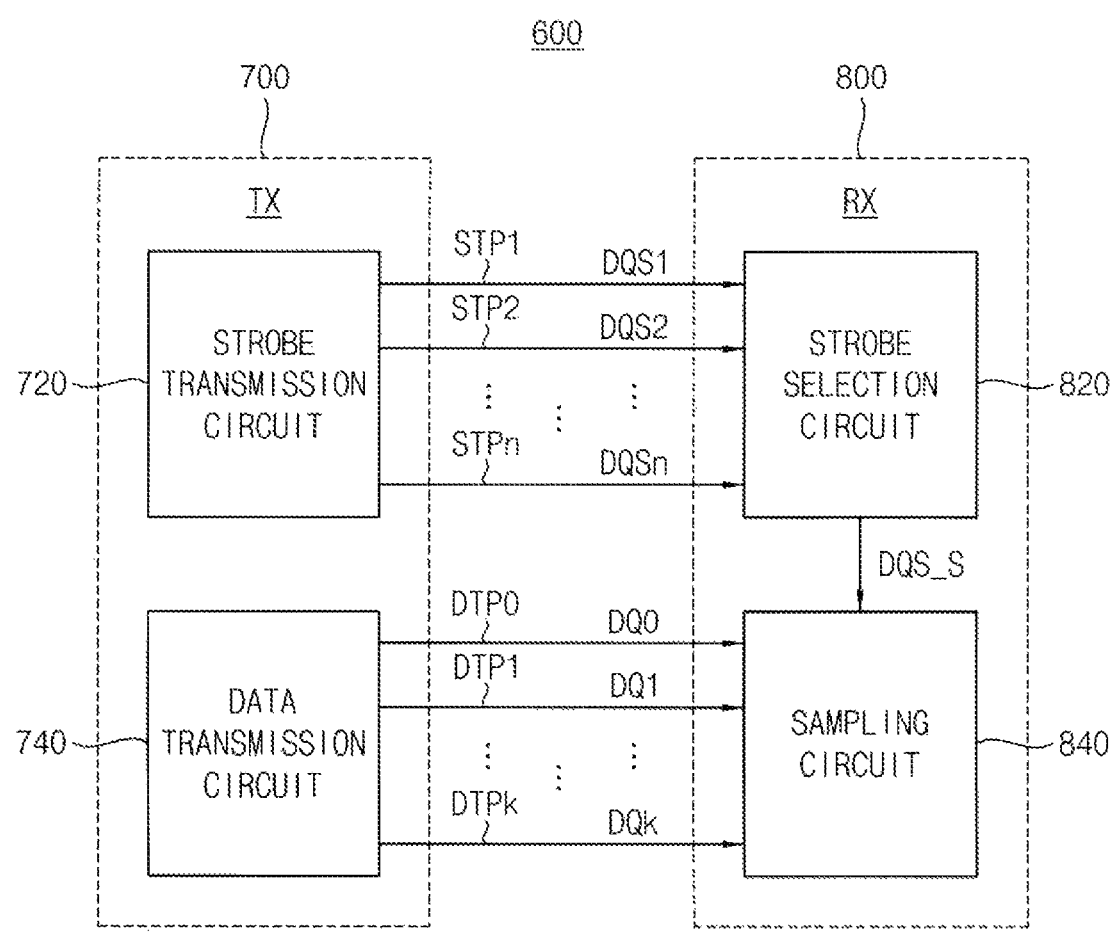
FIG. 3 is a block diagram illustrating interface circuitry according to example embodiments.

FIG. 3 is a block diagram illustrating interface circuitry according to example embodiments.

Referring to FIG. 3, interface circuitry 600 of a memory system may include a transmission interface circuit TX 700, a reception interface circuit RX 800, a plurality of data transfer paths DTP0~DTPk and a plurality of data strobe transfer paths STP1~STPn. For example, each of the data transfer paths DTP0~DTPk and a plurality of data strobe transfer paths STP1~STPn may comprise a single conductor (for "single-ended" signal communication) or may comprise a pair of conductors (for differential signal communication). In some example embodiments, the transmission interface circuit 700 may be included in a memory controller (e.g., 500) and the reception interface circuit 800 may be included in a memory device (e.g., 100). In some example embodiments, the transmission interface circuit 700 may be included in the memory device (e.g., 100) and the reception interface circuit 800 may be included in a memory controller (e.g., 500). In some example embodiments, as described above, each the data input-output unit circuit DIOU of the memory device (e.g., 100) and the memory controller (e.g., 500) may include both a transmission interface circuit TX and a reception interface circuit RX (with the structure and connections described herein) to perform bi-directional data communication.

The transmission interface circuit 700 may include a strobe transmission circuit 720 and a data transmission circuit 740. The strobe transmission circuit 720 may drive data strobe signals DQS1~DQSn on the data strobe transfer paths STP1~STPn to provide the data strobe signals DQS1~DQSn to the reception interface circuit 800. The data transmission circuit 740 may drive a plurality of data signals DQ0~DQk on the data transfer paths DTP0~DTPk to provide the data signals DQ0~DQk to the reception interface circuit 801. Such driving may comprise selectively connecting the data strobe transfer paths STP1~STPn and the data transfer paths DTP0~DTPk to a power supply source of the transmitting device (e.g., for each transfer path, selectively connecting a Vdd power supply or a Vss power supply source to represent a data bit or generate data strobe pulse).

In some example embodiments, as described with reference to FIGS. 6A and 6B, the strobe transmission circuit 720 may include a common data strobe driver configured to drive the plurality of data strobe transfer paths STP1~STPn with a common transmission data strobe signal. In some example embodiments, as described with reference to FIGS. 11A, 11B and 11C, the strobe transmission circuit 720 may include a plurality of data strobe drivers configured to drive the plurality of data strobe transfer paths STP1~STPn, respectively.

The reception circuit 800 may include a strobe selection circuit 820 and a sampling circuit 840. The strobe selection circuit 820 may determine at least one selected data strobe transfer path among the plurality of data strobe transfer paths STP1~STPn to provide at least one data strobe signal DQS_S transferred through the at least one data strobe transfer path. The sampling circuit 840 may sample the plurality of data signals DQ0~DQk transferred through the plurality of data strobe transfer paths DTP0~DTPk using the at least one selected data strobe signal DQS_S, respectively.

Figure 4:
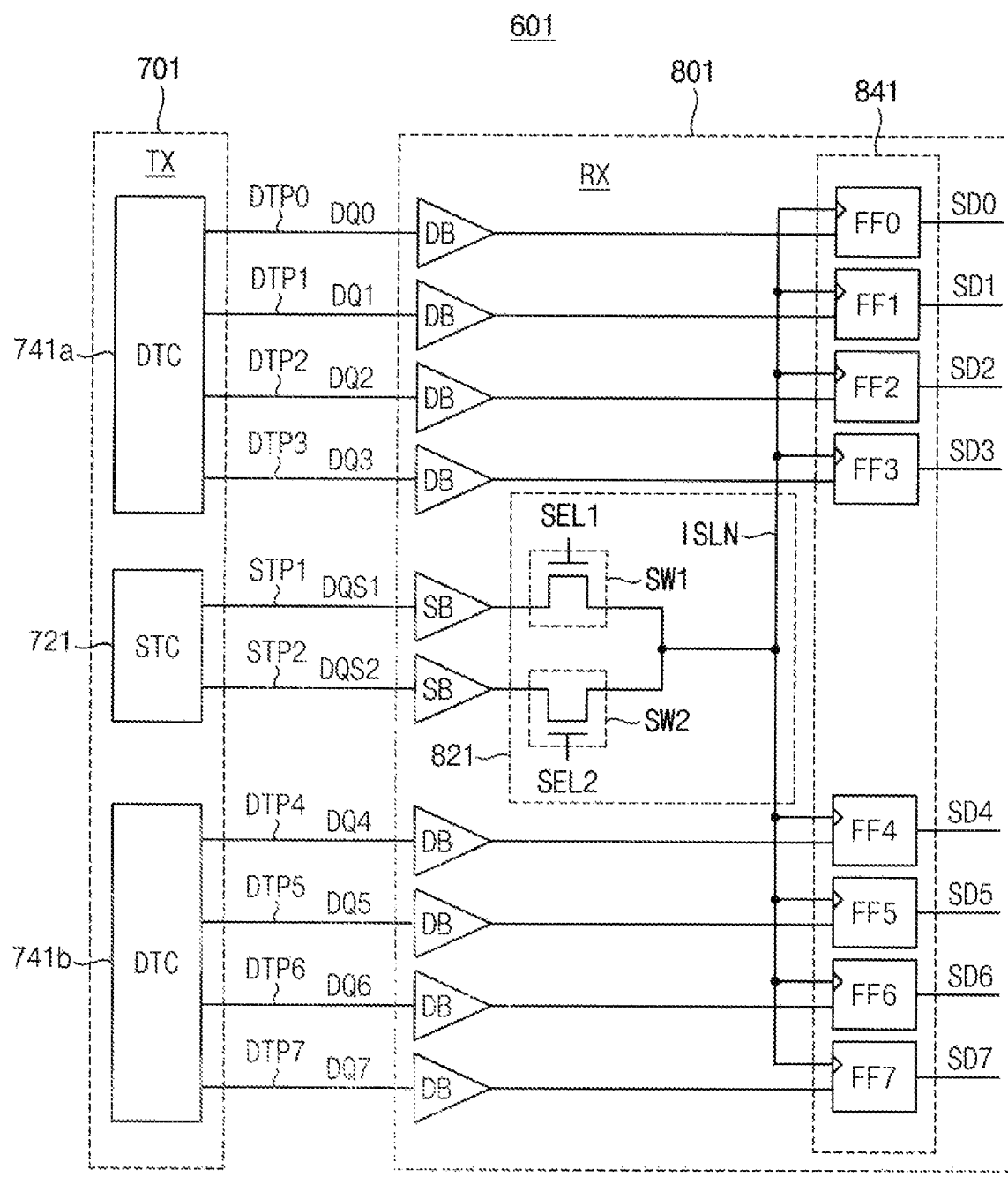
FIG. 4 is a circuit diagram illustrating interface circuitry according to example embodiments.

FIG. 4 is a circuit diagram illustrating interface circuitry according to example embodiments.

Referring to FIG. 4, interface circuitry 601 of a memory system may include a transmission interface circuit TX 701, a reception interface circuit RX 801, a plurality of data transfer paths DTP0~DTP7 and a plurality of data strobe transfer paths STP1 and STP2. Although FIG. 4 illustrates a case that the two data strobe transfer paths STP1 and STP2 are assigned to and shared by the eight data transfer paths DQ0~DQ7, the numbers of the transfer paths may be determined variously. In addition, although FIG. 4 illustrates a case that the data strobe transfer paths STP1 and STP2 are physically located between a first set of data transfer paths DTP0~DTP3 and a second set of data transfer paths DTP4~DTP7, the relative positions of the data transfer paths and the data strobe transfer paths may be implemented differently. As with all the embodiments described herein, the data strobe transfer paths (e.g., STP1 and STP2) and data transfer paths (e.g., DTP0~DTP7) may be formed as wiring (conductive wires) on a printed circuit board and/or as part of package wiring (e.g., redistribution layer wiring of various substrates and/or TSV (through substrate vias) wiring formed within a semiconductor package), such as when the transmitting and receiving devices are a memory device 100 embodied as a semiconductor chip (or a stack of semiconductor chips) and a memory controller 500 embodied as a separate semiconductor chip. The data strobe transfer paths (e.g., STP1 and STP2) and data transfer paths (e.g., DTP0~DTP7) may also be formed as wiring within one or more layers of the same semiconductor chip, such as when the transmitting and receiving devices are formed within the same integrated circuit (e.g., as part of the same system on a chip, or SoC).

The transmission interface circuit 701 may include a strobe transmission circuit STC 721 and a data transmission circuit DTC 741a and 741b. The strobe transmission circuit 721 may drive one or more data strobe signals DQS1 and DQS2 on corresponding one of the data strobe transfer paths STP1 and STP2 to provide the one or more data strobe signals (e.g., one or both of DQS1 and DQS2) to the reception interface circuit 801. The data transmission circuit 741a and 741b may drive each of the data signals DQ0~DQ7 on a corresponding data transfer paths DTP0~DTP7 to provide the data signals DQ0~DQ7 to the reception interface circuit 801.

The reception circuit 801 may include data reception buffers DB, strobe reception buffers SB, a strobe selection circuit 821 and a sampling circuit 841. The data reception buffers DB may buffer and provide the data signals DQ0~DQ7, respectively. The strobe reception buffers SB may buffer and provide the data strobe signals DQS1 and DQS2, respectively. The buffering of the buffers DB and SB may comprise an inverter or a several inverters connected in series to provide the data signals DQ0~DQ7 and data strobe signals DQS1 and DQS2 with a stronger signal strength (which may provide higher power) as compared to those received. It will be appreciated that form of the data signals DQ0~DQ7 and/or data strobe signals DQS1 and DQS2 may be inverted at the output of the buffers DB and SB, which, for the purposes of this application, shall be considered the same signals as if they had not been inverted. According to example embodiments, the data reception buffers DB and/or the strobe reception buffers SB may be omitted, or may be provided in other locations, such as external to the receiving device in the transfer paths DTP and STP or in the circuits 821 and 841 of the receiving device.

The strobe selection circuit 821 may select one data strobe transfer path among the data strobe transfer paths STP1 and STP2 to provide a corresponding selected data strobe signal DQS1 or DQS2 that was transferred through the selected data strobe transfer path. In this example, a selected subset of data strobe transfer paths STP is equal to one, but a selected subset of data strobe transfer paths STP may be plural (and as such, the selected data strobe signals DQS transmitted on these selected data strobe transfer paths STP may be plural). In addition, in some embodiments, the strobe selection circuit may be configured to select all of the data strobe transfer paths STP such that all of the corresponding transmitted data strobe signals DQS may be used to obtain (e.g., provide timing to latch) the data signals DQ0~DQ7.

The strobe selection circuit 821 may include an internal strobe supply line ISLN and a plurality of switch circuits SW1 and SW2. The internal strobe supply line ISLN is connected commonly to the plurality of latch circuits FF0~FF7 to provide the selected data strobe signal to the latch circuits FF0~FF7. The switch circuits SW1 and SW2 may selectively connect each of the data strobe transfer paths STP1 and STP2 to the internal strobe supply line ISLN. In this example, one of the data strobe transfer paths STP1 and STP2 is connected to the internal strobe supply line ISLN depending on the selected data strobe transfer path (STP1 or STP2).

The switch circuits SW1 and SW2 may be turned on or off based on switch control signals SEL1 and SEL2, respectively. One of the switch control signals SEL1 and SEL2 may be activated to select one of the data strobe transfer paths STP1 and STP2 as the selected data strobe transfer path and provide one of the data strobe signals DQS1 and DQS2 as the selected data strobe signal. For example, the switch control signals SEL1 and SEL2 may be provided from the controller 520 in FIG. 2 (e.g., on signal lines from the controller 520, or from intervening circuitry configured by the controller 520, such as by programming a register and/or setting latches having signal line outputs to the strobe selection circuit 821). The switch control signals SEL1 and SEL2 may be logical inverse of one another so that, during operation, at any one time, only one of switches SW1 and SW2 is turned on while the other is turned off (and thus, only one of the data strobe transfer paths is selectively connected to the internal strobe supply line ISLN at any one time). Example embodiments of determining the selection of a data strobe signal will be described below with reference to FIGS. 5, 6A and 6B.

As illustrated in FIG. 4, the sampling circuit 841 may include the latch circuits (or latches) FF0~FF7 configured to sample and latch the data signals DQ0~DQ7 transferred through the data strobe transfer paths DTP0~DTP7 using the selected data strobe signal, respectively. In some example embodiments, the latch circuits FF0~FF7 may comprise flip-flops that each sample and latch a corresponding one of the data signals DQ0~DQ7 in response to the selected data strobe signal. The flip-flops FF0~FF7 may latch the data signals DQ0~DQ7 at a timing determined by the selected data strobe signal, such as latching the data signals DQ0~DQ7 in synchronization with rising edges and/or falling edges of the selected data strobe signal to provide sampled data SD0~SD7.

Figure 5:
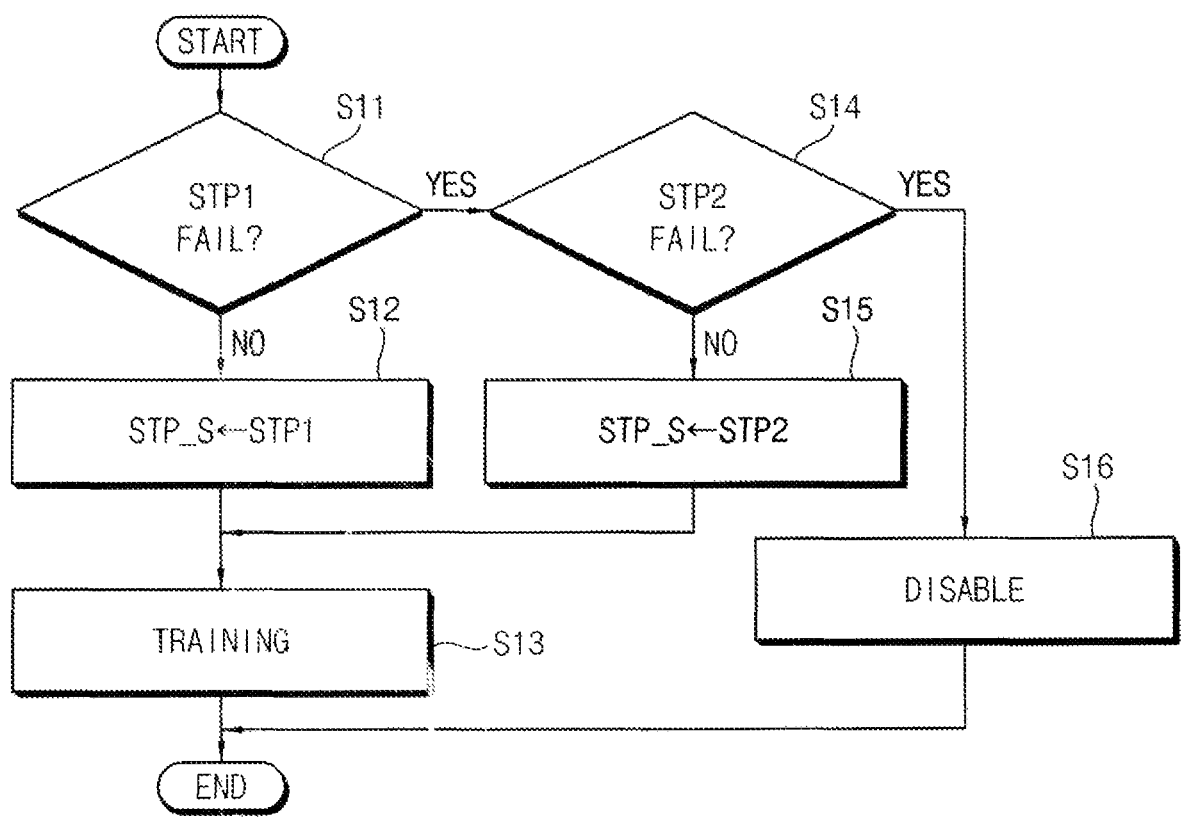
FIG. 5 is a flow chart illustrating an example embodiment of determining a selected data strobe transfer path with respect to the interface circuitry of FIG. 4.

FIG. 5 is a flow chart illustrating an example embodiment of determining a selected data strobe transfer path with respect to the interface circuitry of FIG. 4.

Referring to FIGS. 4 and 5, the first data strobe transfer path STP1 among the plurality of data strobe transfer paths STP1 and STP2 is analyzed to determine if it has failed (S11). Although determination of failure of a data strobe transfer path as described herein may indicate the data strobe transfer path is defective, it will be appreciated that a data strobe transfer path may still be operable to be used with the transfer data (over the data transfer paths), but may be considered failed or defective as a result of sub-optimal performance. Such sub-optimal performance may include generating (or being associated with) a bit error rate of transferred data that is greater than a predetermined threshold, a bit error rate of transferred data greater than other bit error rates when using other data strobe transfer paths, and/or requiring lower data transfer rates (i.e., a lower data strobe frequency) to be used to obtain error free data (or data with an acceptable level of bit errors that may be corrected through ECC using the ECC engine of the receiving device).

When the first data strobe transfer path STP1 has not failed (S11: NO), the first data strobe transfer path STP1 is determined as the selected data strobe transfer path STP_S (S12). In this case, a first data strobe signal DQS1 transferred through the first data strobe transfer path STP1 corresponds to the selected data strobe signal. Based on the first data strobe signal DQS1, a training process is performed set the phase of the data signals DQ0~DQ7 with respect to the first data strobe signal DQS1 which may comprise adjusting at least one of a phase of the first data strobe signal DQS1 and phases of the data signals DQ0~DQ7 (S13). The training process will be further described below with reference to FIGS. 7 and 8.

When the first data strobe transfer path STP1 has failed (S11: YES), a second data strobe transfer path STP2 among the plurality of data strobe transfer paths STP1 and STP2 is analyzed to determine if it has failed (S14).

When the second data strobe transfer path has not failed (S14: NO), the second data strobe transfer path STP2 is determined as the selected data strobe transfer path (S15). In this case, a second data strobe signal DQS2 transferred through the second data strobe transfer path STP2 corresponds to the selected data strobe signal. Based on the second data strobe signal DQS2, the training process is performed to set the phase of the data signals DQ0~DQ7 with respect to the second data strobe signal DQS2 which may comprise adjusting adjust at least one of a phase of the second data strobe signal DQS2 and phases of the data signals DQ0~DQ7 (S13).

When the second data strobe transfer path STP2 has failed (S14: YES), it is determined that the data strobe transfer paths STP1 and STP2 are both unusable and the corresponding data input-output unit circuit DIOU may be disabled (S16).

As such, it may be determined whether each of the data strobe transfer paths STP1 and STP2 have failed sequentially with respect to the plurality of the data strobe transfer paths STP1 and STP2 until an operable data strobe transfer path (e.g., a not-failed data strobe transfer path) is determined among the plurality of data strobe transfer paths STP1 and STP2. The first determined operable data strobe transfer path among the plurality of data strobe transfer paths STP1 and STP2 may be determined as the selected data strobe transfer path STP_S.

The failure of the data strobe transfer path may be analyzed using various methods. In some example embodiments, operation status or operation characteristics of the analyzed data strobe transfer path may be detected, for example, by measuring eye dimensions of the analyzed data strobe signal. Whether the analyzed data strobe transfer path has failed may be determined based on the measured eye dimensions. The eye dimension of a data strobe transfer path may be a time period during which pulses of the data strobe signal has reached a desired voltage level (e.g., for a positive pulse of the data strobe signal, the time between completion of a rising edge of the positive pulse of the data strobe signal and the beginning of the immediately following falling edge, and for a negative pulse of the data strobe signal, the time between completion of a falling edge of the negative pulse of the data strobe signal and the beginning of the immediately following rising edge). In some example embodiments, an ECC decoding may be performed with respect to data sampled based on the selected data strobe signal. If it is determined that errors cannot be corrected as a result of the ECC decoding, the analyzed data strobe transfer path may be determined as having failed. Although FIG. 5 illustrates training step S13 occurring after analysis (and possible determination of failure) of a data strobe transfer path in steps S11 and S12, failure of a data strobe transfer path may be performed as part of the training in step S13 (either in addition to or as a further failure analysis to step S11, e.g.). For example, after an initial selection of a data strobe transfer path, training in step S13 may reveal an unacceptable data strobe signal waveform transferred by the data strobe transfer path (that is revealed by the training) and thus causes a determination that the data strobe transfer path has failed. For example, eye dimensions of the data strobe signal transferred by the data strobe transfer path may be determined to be less than a desired threshold during training and thus cause the data strobe transfer path to be considered as defective. As another example, the ECC decoding discussed herein used to determine a failed data strobe transfer path may be performed after training in step S13. Further, analysis of data strobe transfer path failure may occur during both initiation of the semiconductor device and during later operation of the semiconductor device. When failure is detected at such later times, the process of FIG. 5 may transition to the step of analyzing whether the next data strobe transfer path has failed (e.g., transition to step S14 if it is later determined that data strobe transfer path STP1 has failed).

FIGS. 6A and 6B are diagrams for describing the example embodiment of FIG. 5. Some components in FIG. 5 are omitted in FIGS. 6A and 6B for convenience of illustration.

Referring to FIGS. 6A and 6B, the strobe transmission circuit 721 may include a common data strobe driver SDR. The data strobe driver SDR is connected and configured to drive the plurality of data strobe transfer paths STP1 and STP2 with a common transmission data strobe signal TDQS. The strobe selection circuit 821 may include the internal strobe supply line ISLN and the plurality of switch circuits SW1 and SW2 as described above.

FIG. 6A illustrates a case when the first data strobe transfer path STP1 is selected as the data strobe transfer path STP_S and FIG. 6B illustrates a case when the second data strobe transfer path STP2 is selected as the data strobe transfer path STP_S.

As illustrated in FIG. 6A, when the first data strobe transfer path STP1 is determined as the selected data strobe transfer path STP_S, the first switch circuit SW1 is turned on and the second switch circuit SW2 is turned off. In this case, the first data strobe signal DQS1 is transferred through the first data strobe transfer path STP1 and corresponds to the selected data strobe signal DQS_S as a result of this selection. As a result, the first data strobe signal DQS1 may be provided to the latch circuits FF0~FF7 through the internal strobe supply line ISLN.

As illustrated in FIG. 6B, when the second data strobe transfer path STP2 is selected as the data strobe transfer path STP_S, the first switch circuit SW1 is turned off and the second switch circuit SW2 is turned on. In this case, the second data strobe signal DQS2 is transferred through the second data strobe transfer path STP2 and corresponds to the selected data strobe signal DQS_S as a result of this selection. As a result, the second data strobe signal DQS2 may be provided to the latch circuits FF0~FF7 through the internal strobe supply line ISLN.

As such, one data strobe transfer path may be selected by turning on the one switch circuit among the plurality of switch circuits SW1 and SW2 and turning off the rest of the plurality of switch circuit SW1 and SW2.

Figure 7:
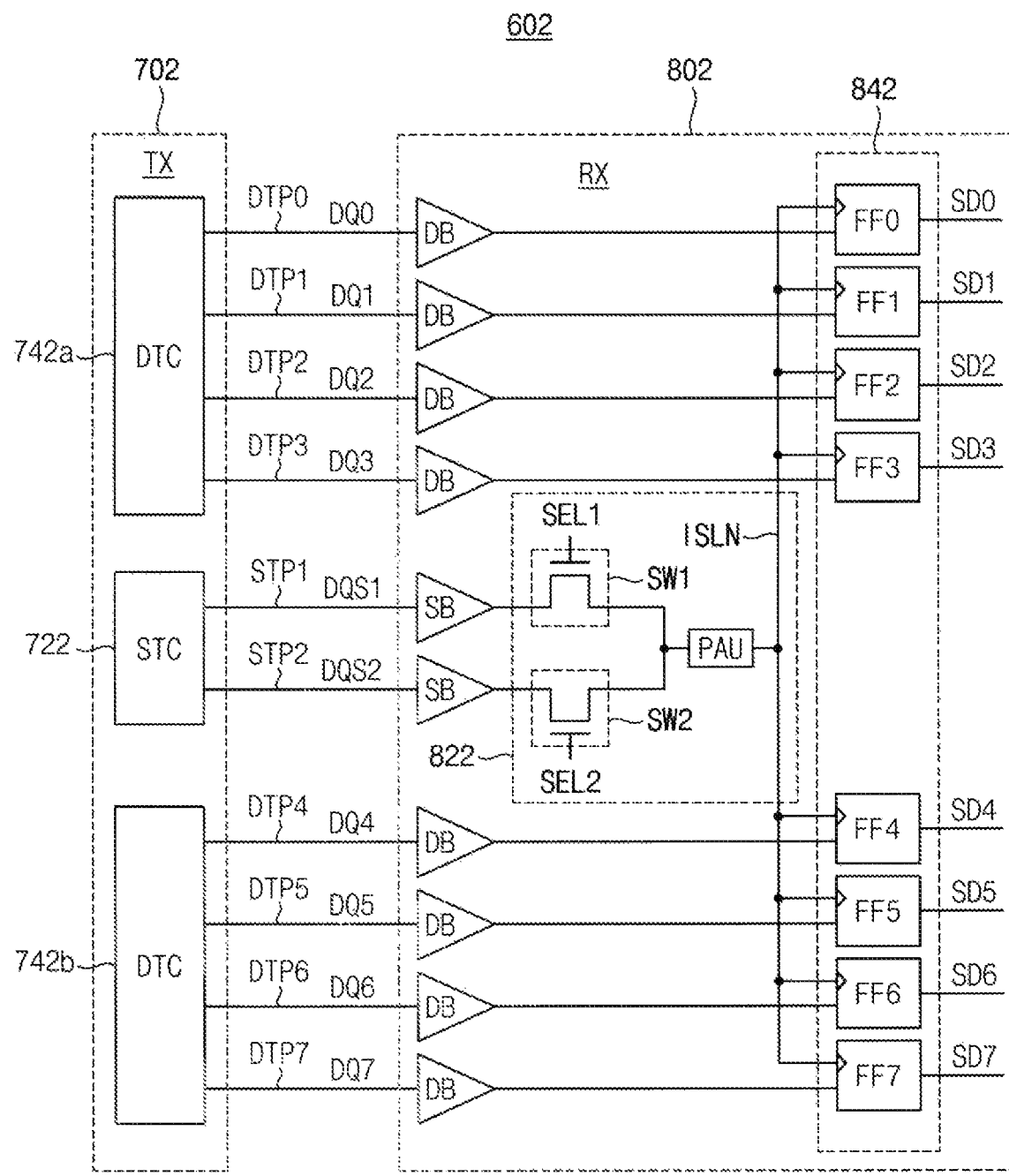
FIGS. 7 and 8 are circuit diagrams illustrating interface circuitry having phase adjustment function according to example embodiments.
Figure 8:
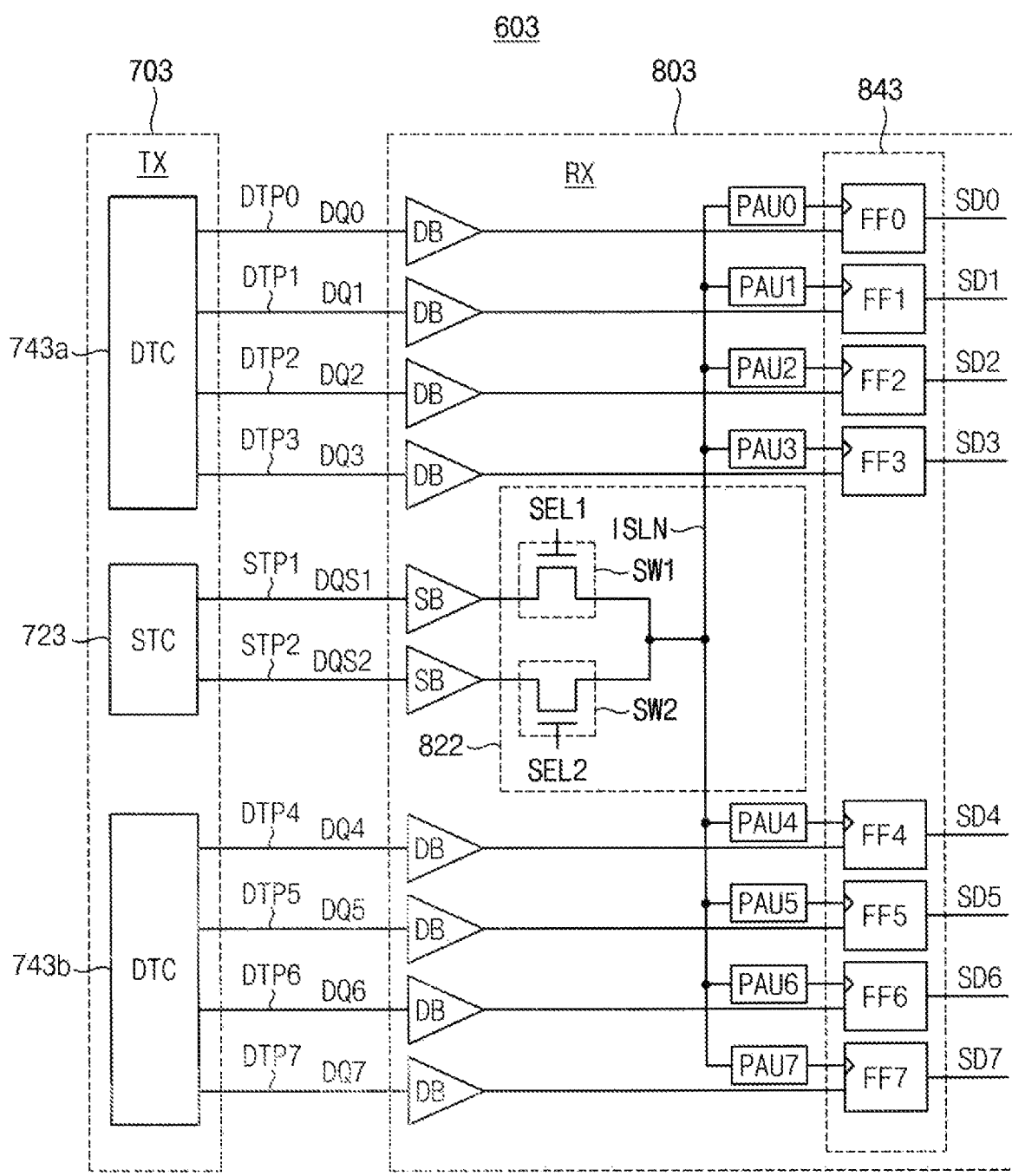

FIGS. 7 and 8 are circuit diagrams illustrating interface circuitry having phase adjustment circuits according to example embodiments.

Referring to FIG. 7, interface circuitry 602 of a memory system may include a transmission interface circuit TX 702, a reception interface circuit RX 802, a plurality of data transfer paths DTP0~DTP7, a plurality of data strobe transfer paths STP1 and STP2 and a phase adjustment unit circuit PAU. The transmission unit 702 may include a strobe transmission circuit STC 722 and a data transmission circuit DTC 742a and 742b. The reception circuit 802 may include data reception buffers DB, strobe reception buffers SB, a strobe selection circuit 822 and a sampling circuit 842. The interface circuitry 602 of FIG. 7 may be the same as the interface circuitry 601 of FIG. 4 except for the addition of the phase adjustment unit circuit PAU, and thus the repeated descriptions are omitted.

As illustrated in FIG. 7, the one phase adjustment unit circuit PAU may be disposed between the switch circuits SW1 and SW2 and the internal strobe supply line ISLN. In general, the training process may be performed in the memory system to adjust relative phases or skews between the data strobe signal and the data signals to adjust the timing of latching of the data signals in response to the data strobe signal and thus optimize latching of the data signals. The result of the training process may provide a delay amount of the data strobe signal. The phase adjustment unit circuit PAU may include a variable delay circuit configured to delay the selected data strobe signal by the delay amount and to provide the delayed data strobe signal to latch circuits FF0 to FF7. The delay amount may be selected to provide a data strobe signal that cause latch circuits FF0 to FF7 to latch respective ones of data signals DQ0~DQ7 at or near the center of a window of each of such signals that represents a data bit value being transferred.

In some example embodiments, the phase adjustment unit circuit PAU may include a storage component such as a register to store the delay amount. In some example embodiments, the phase adjustment unit circuit PAU may receive a control signal indicating the delay amount, for example, from the controller 520 in FIG. 2. The phase adjustment unit circuit PAU may implement a variable delay signal path between its input of the data strobe signal and its output of the delayed data strobe signal, the variable delay signal path being responsive to the delay amount provided by the register and/or controller 520 to provide a corresponding delay. For example, a number of a plurality of delay circuits (e.g., a series of inverters) may be linked together in series, such a number corresponding to the delay amount.

Referring to FIG. 8, an interface circuitry 603 of a memory system may include a transmission interface circuit TX 703, a reception interface circuit RX 803, a plurality of data transfer paths DTP0~DTP7, a plurality of data strobe transfer paths STP1 and STP2 and a plurality of phase adjustment unit circuits PAU0~PAU7. The transmission unit 703 may include a strobe transmission circuit STC 723 and a data transmission circuit DTC 743a and 743b. The reception circuit 803 may include data reception buffers DB, strobe reception buffers SB, a strobe selection circuit 823 and a sampling circuit 843. The interface circuitry 603 of FIG. 8 may be the same as the interface circuitry 601 of FIG. 4 and the interface circuitry 602 of FIG. 7 except for the addition of the phase adjustment unit circuits PAU0~PAU7, and thus the repeated descriptions are omitted.

As illustrated in FIG. 8, the phase adjustment circuit units PAU0~PAU7 may be disposed between the internal strobe supply line ISLN and the latch circuits FF0~FF7, respectively. The phase adjustment unit circuits PAU0~PAU7 may have the same structure and individual operation as described with respect to the phase adjustment unit circuit PAU of FIG. 7. However, each of these phase adjustment unit circuits PAU0 to PAU7 may receive a separately determined delay amount (e.g., from a corresponding register and/or a signal from controller 520) so that the phase adjustment may be performed separately and for different amounts of delay in setting the phase of each data signal DQ0~DQ7 and the selected data strobe signal. Thus, the latching operation may be performed by each latch circuit FF0~FF7 at an optimum time (e.g., at a center of the window of the data signal representing the data bit being transmitted) as determined by training and thus the latching operations of latch circuits FF0~FF7 may initiate at different times. It should be appreciated that the phase adjustment and phase adjustment unit circuits described herein may result in substantially no delay (e.g., no insertion of additional delay into the relevant signal paths in which the phase adjustment unit circuit is inserted), depending on the results determined from training FIG. 9 is a circuit diagram illustrating interface circuitry according to example embodiments.

Figure 9:
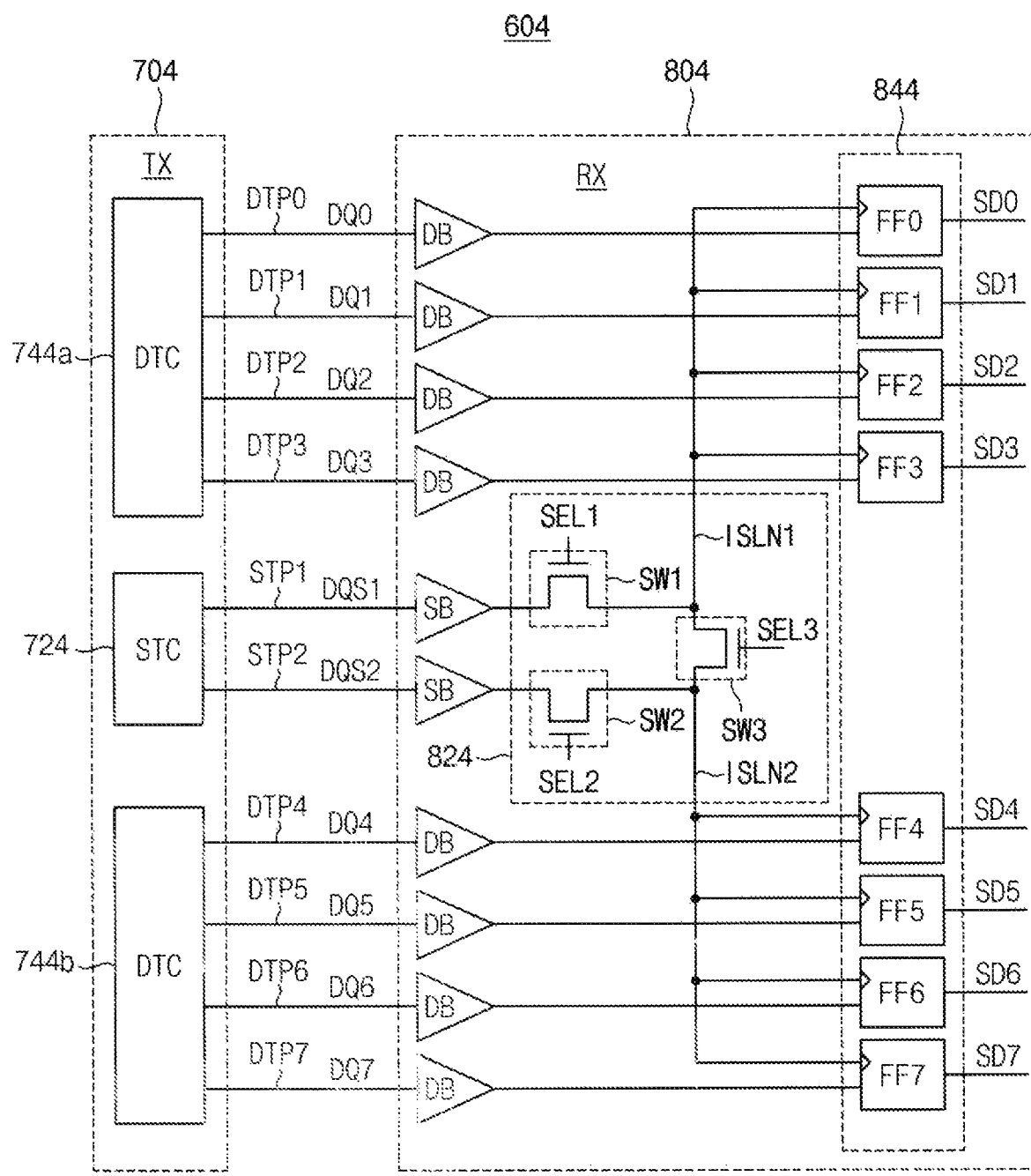
FIG. 9 is a circuit diagram illustrating interface circuitry according to example embodiments.

Referring to FIG. 9, an interface circuitry 604 of a memory system may include a transmission interface circuit TX 704, a reception interface circuit RX 804, a plurality of data transfer paths DTP0~DTP7 and a plurality of data strobe transfer paths STP1 and STP2. Although FIG. 9 illustrates a case that the two data strobe transfer paths STP1 and STP2 are assigned to and shared by the eight data transfer paths DQ0~DQ7, the numbers of the transfer paths may vary depending on design. In addition, although FIG. 9 illustrates a case that the data strobe transfer paths STP1 and STP2 are physically located between a first set of data transfer paths DTP0~DTP3 and a second set of data transfer paths DTP4~DTP7, the relative positions of the data transfer paths and the data strobe transfer paths may be otherwise.

The transmission unit 704 may include a strobe transmission circuit STC 724 and a data transmission circuit DTC 744a and 744b. The reception circuit 804 may include data reception buffers DB, strobe reception buffers SB, a strobe selection circuit 824 and a sampling circuit 844. The interface circuitry 604 of FIG. 9 is may be the same as the interface circuitry 601 of FIG. 4 except for the provision of the strobe selection circuit 824, and thus the repeated descriptions are omitted. Although not shown, phase adjustment unit circuits PAU of FIG. 7 and/or FIG. 8 may also be provided as described herein and thus repeated descriptions are also omitted.

The strobe selection circuit 824 may determine at least one selected data strobe transfer path among the data strobe transfer paths STP1 and STP2 to provide at least one data strobe signal DQS1 and DQS2 transferred through the at least one data strobe transfer path.

The strobe selection circuit 824 may include a first internal strobe supply line ISLN1, a second internal strobe supply line ISLN2, a first switch circuit SW1, a second switch circuit SW2 and a third switch circuit SW3.

The first internal strobe supply line ISLN1 is connected commonly to a first set of latch circuits FF0~FF3 among the plurality of latch circuits FF0~FF7 to provide the at least one selected data strobe signal to the first set of latch circuits FF0~FF3. The second internal strobe supply line ISLN2 is connected commonly to a second set of latch circuits FF4~FF7 among the plurality of latch circuits FF0~FF7 to provide the at least one selected data strobe signal to the second set of latch circuits FF4~FF7.

The first switch circuit SW1 may selectively connect a first data strobe transfer path STP1 among the plurality of data strobe transfer paths STP1 STP2 to the first internal strobe supply line ISLN1. The second switch circuit SW2 may selectively connect a second data strobe transfer path STP2 among the plurality of data strobe transfer paths STP1 and STP2 to the second internal strobe supply line ISLN2. The third switch circuit SW3 may selectively connect the first internal strobe supply line ISLN1 and the second internal strobe supply line ISLN2.

The first, second and third switch circuits SW1, SW2 and SW3 may be turned on or off based on first, second and third switch control signals SEL1, SEL2 and SEL3, respectively. One of the switch control signals SEL1 and SEL2 may be activated to select one of the data strobe transfer paths STP1 and STP2 as the selected data strobe transfer path and provide one of the data strobe signals DQS1 and DQS2 as the selected data strobe signal to all of the latch circuits FF0~FF7 by also turning on third switch circuit SW3. Alternatively, both of the switch control signals SEL1 and SEL2 may be activated to select both of the data strobe transfer paths STP1 and STP2 as the at least one selected data strobe transfer path and provide both of the data strobe signals DQS1 and DQS2 as the at least one selected data strobe signal (i.e., DQS1 to latch circuits FF0~FF3 via first internal strobe supply line ISNL1 and DQS2 to latch circuits FF4~FF7 via second internal strobe supply line ISNL2). For example, the switch control signals SEL1, SEL2 and SEL3 may be provided from the controller 520 in FIG. 2. Example embodiments of determining a selected data strobe signal will be described below with reference to FIGS. 10, 11A, 11B and 11C.

Figure 10:
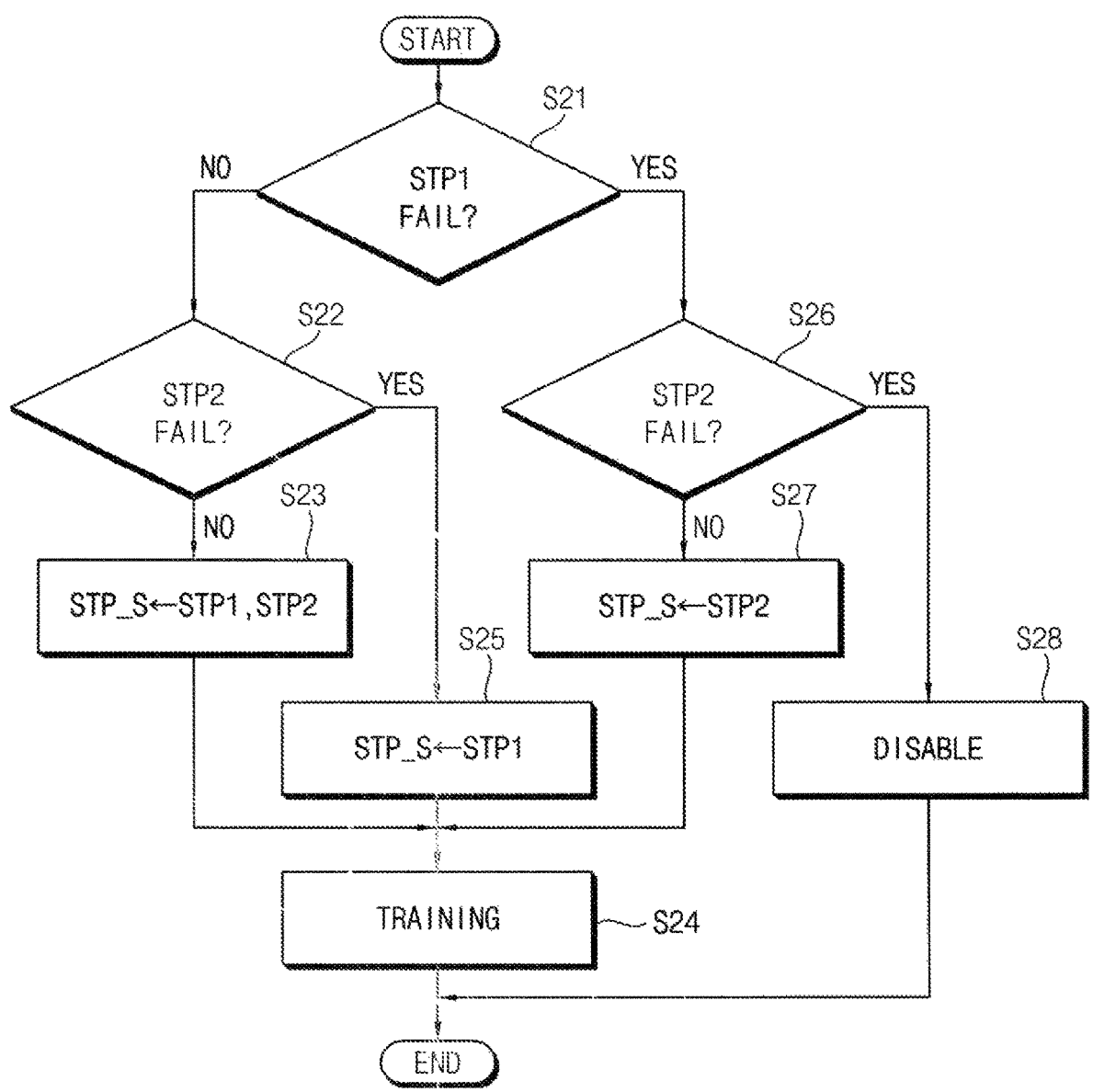
FIG. 10 is a flow chart illustrating an example embodiment of determining at least one selected data strobe transfer path with respect to the interface circuitry of FIG. 9.

FIG. 10 is a flow chart illustrating an example embodiment of determining at least one selected data strobe transfer path with respect to the interface circuitry of FIG. 9.

Referring to FIGS. 9 and 10, it is determined whether a first data strobe transfer path STP1 among the plurality of data strobe transfer paths STP1 and STP2 has failed (S21). In addition, regardless of the failure of the first data strobe transfer path STP1, it is determined whether a second data strobe transfer path STP2 among the plurality of data strobe transfer paths STP1 and STP2 has failed (S22, S26).

When both of the first and second data strobe transfer paths STP1 and STP2 have not failed (S22: NO), both of the first and second data strobe transfer paths STP1 and STP2 are selected as the at least one selected data strobe transfer path STP_S (S23). In this case, a first data strobe signal DQS1 is transferred through the first data strobe transfer path STP1 and a second data strobe signal DQS2 is transferred through the second data strobe transfer path STP2 and the first and second data strobe signals DQS1 and DQS2 correspond to the at least one selected data strobe signal. Using the first and second data strobe signals DQS1 and DQS2, a training process is performed to adjust at least one of phases of the first and second data strobe signals DQS1 and DQS2 (e.g., in a manner described with respect to FIG. 7 but using two phase adjustment unit circuits to adjust the phase of each of the data strobe signals DQS1 and DQS2 individually) and phases of the data signals DQ0~DQ7 (S24) (e.g., in a manner described with respect to FIG. 8).

When the first data strobe transfer path STP1 has not failed and the second data strobe transfer path STP2 has failed (S22: YES), the first data strobe transfer path STP1 is selected as the at least one data strobe transfer path STP_S (S25). In this case, the first data strobe signal DQS1 corresponds to the at least one selected data strobe signal. Based on the first data strobe signal DQS1, the training process is performed to adjust at least one of the phase of the first data strobe signal DQS1 and the phases of the data signals DQ0~DQ7 (S24).

When the first data strobe transfer path STP1 has failed and the second data strobe transfer path STP2 has not failed (S26: NO), the second data strobe transfer path STP2 is selected as the at least one selected data strobe transfer path STP_S (S27). In this case, the second data strobe signal DQS2 corresponds to the at least one selected data strobe signal. Based on the second data strobe signal DQS2, the training process is performed to adjust at least one of the phase of the second data strobe signal DQS2 and the phases of the data signals DQ0~DQ7 (S24).

When both of the first and second data strobe transfer paths STP1 and STP2 have failed (S26: YES), it is determined that the data strobe transfer paths STP1 and STP2 are unusable and the corresponding data input-output unit circuit DIOU may be disabled (S28).

As such, it may be determined whether each of the data strobe transfer paths STP1 and STP2 have failed with respect to all of the plurality of data strobe transfer paths STP1 and STP2. One or more data strobe transfer paths among the plurality of data strobe transfer paths STP1 and STP2 may be determined as the at least one selected data strobe transfer path STP_S based on a result of the determination.

Figure 11A:
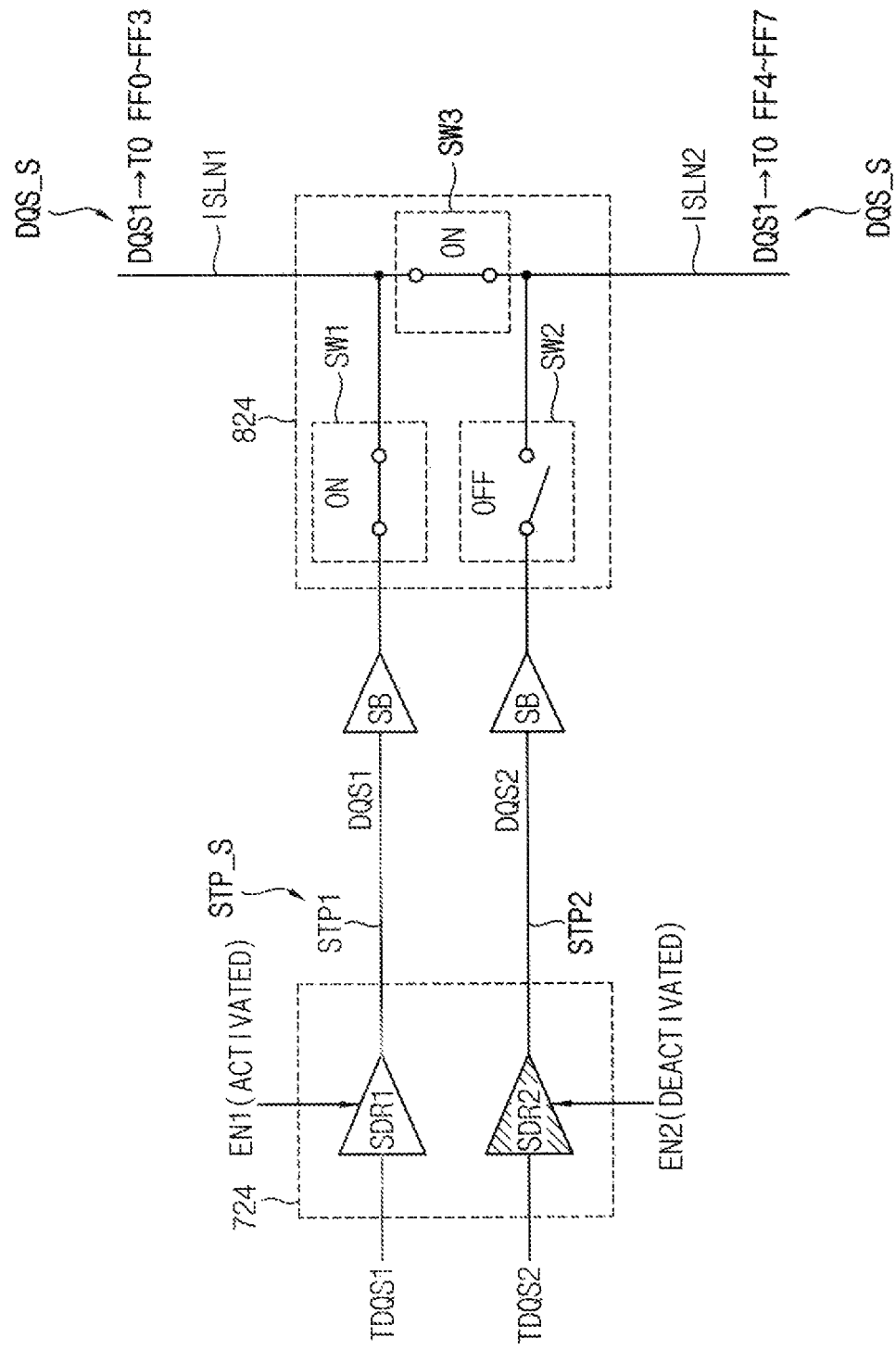
FIGS. 11A, 11B and 11C are diagrams for describing the example embodiment of FIGS. 9 and 10.
Figure 11B:
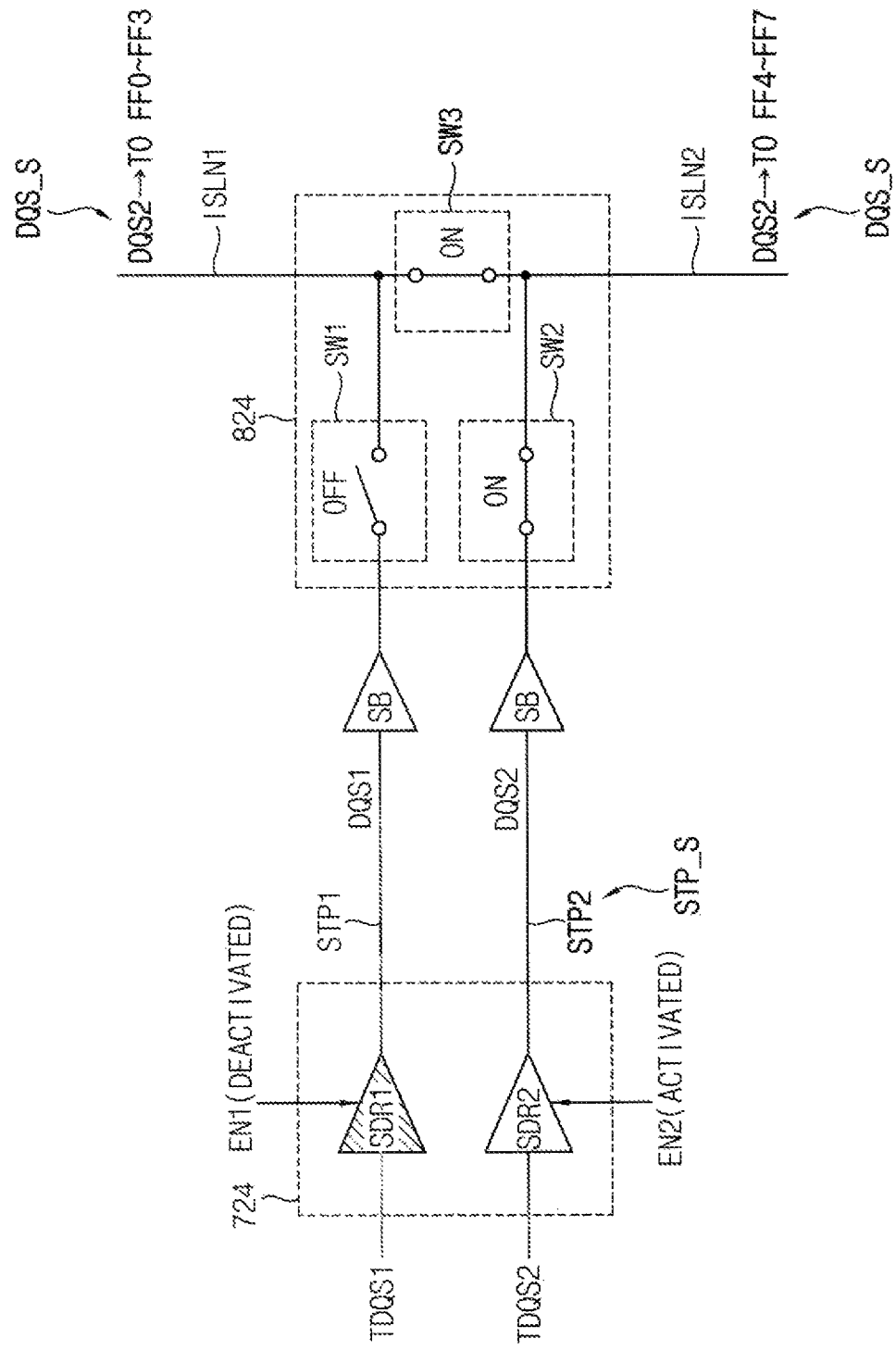
Figure 11C:
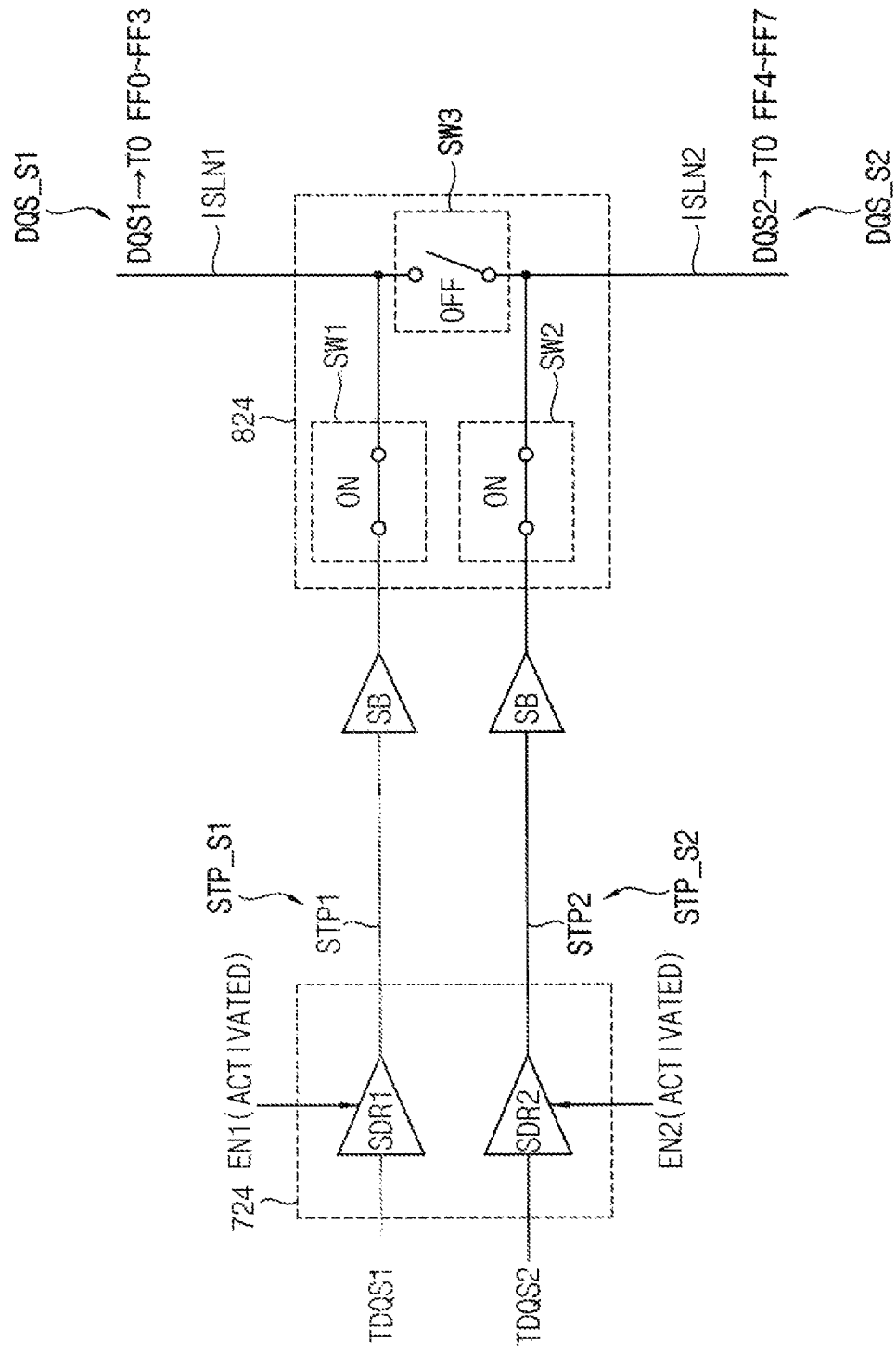

FIGS. 11A, 11B and 11C are diagrams for describing the example embodiment of FIGS. 9 and 10. Some components in FIG. 9 are omitted in FIGS. 11A, 11B and 11C for convenience of illustration.

Referring to FIGS. 11A, 11B and 11C, the strobe transmission circuit 724 may include a plurality of data strobe drivers, for example, first and second data strobe drivers SDR1 and SDR2 configured to drive the plurality of data strobe transfer paths STP1 and STP2 with transmission data strobe signals TDQS1 and TDQS2, respectively. The strobe selection circuit 824 may include the first and second internal strobe supply lines ISLN1 and ISLN2 and the first, second and third switch circuits SW1, SW2 and SW3 as described above.

FIG. 11A illustrates a case when the first data strobe transfer path STP1 is determined as the at least one selected data strobe transfer path STP_S, FIG. 11B illustrates a case when the second data strobe transfer path STP2 is determined as the at least one selected data strobe transfer path STP_S, and FIG. 11C illustrates a case when both of the first and second data strobe transfer paths STP1 and STP2 are determined as the at least one selected data strobe transfer path STP_S.

As illustrated in FIG. 11A, when the first data strobe transfer path STP1 is selected as the data strobe transfer path STP_S, the first and third switch circuits SW1 and SW3 are turned on and the second switch circuit SW2 is turned off. A first enable signal EN1 may be activated to enable the first data strobe driver SDR1 and a second enable signal EN2 may be deactivated to disable the second data strobe driver SDR2. In this case, the first data strobe signal DQS1 is transferred through the first data strobe transfer path STP1 and corresponds to the selected data strobe signal DQS_S. As a result, the first data strobe signal DQS1 may be provided to the latch circuits FF0~FF7 through the first and second internal strobe supply lines ISLN1 and ISLN2.

As illustrated in FIG. 11B, when the second data strobe transfer path STP2 is selected as the selected data strobe transfer path STP_S, the second and third switch circuits SW2 and SW3 are turned on and the first switch circuit SW1 is turned off. The first enable signal EN1 may be deactivated to disable the first data strobe driver SDR1 and the second enable signal EN2 may be activated to enable the second data strobe driver SDR2. In this case, the second data strobe signal DQS2 transferred through the second data strobe transfer path STP2 corresponds to the selected data strobe signal DQS_S. As a result, the second data strobe signal DQS2 may be provided to the latch circuits FF0~FF7 through the first and second internal strobe supply lines ISLN1 and ISLN2.

As illustrated in FIG. 11C, when both of the first and second data strobe transfer paths STP1 and STP2 are selected as the at least one selected data strobe transfer path STP_S1 and STP_S2, the first and second switch circuits SW1 and SW2 are turned on and the third switch circuit SW3 is turned off. Both of the first and second enable signals EN1 and EN2 may be activated to enable both of the first and second data strobe drivers SDR1 SDR2. In this case, the first data strobe signal DQS1 transferred through the first data strobe transfer path STP1 corresponds to the first selected data strobe signal DQS S1 and the second data strobe signal DQS2 transferred through the second data strobe transfer path STP2 corresponds to the second selected data strobe signal DQS_S2. As a result, the first data strobe signal DQS1 may be provided to the first set of latch circuits FF0~FF3 through the first internal strobe supply line ISLN1, and the second data strobe signal DQS2 may be provided to the second set of latch circuits FF4~FF7 through the second internal strobe supply line ISLN2.

Accordingly, when both of the first and second data strobe transfer paths STP1 and STP2 are selected as the at least one selected data strobe transfer path STP_S1 and STP_S2, a first set of data signals DQ0~DQ3 transferred through a first set of data transfer paths DTP0~DTP3 among the plurality of data transfer paths DTP0~DTP7 may be sampled using the first data strobe signal DQS1 transferred through the first data strobe transfer path STP1 and a second set of data signals DQ4~DQ7 transferred through a second set of data transfer paths DTP4~DTP7 among the plurality of the data transfer paths DTP0~DTP7 may be sampled using the second data strobe signal DQS2 transferred through the second data strobe transfer path STP2.

As such, when only one data strobe transfer path among the first and second data strobe transfer paths STP1 and STP2 has not failed, the one data strobe transfer path that has not failed may be selected as the at least one selected data strobe transfer path STP_S, as described with reference to FIGS. 11A and 11B. In contrast, when both of the first and second data strobe transfer paths STP1 and STP2 have not failed, both of the first and second data strobe transfer paths STP1 and STP2 may be determined as the at least one selected data strobe transfer path STP_S, as described with reference to FIG. 11C.

The first and second enable signals EN1 and EN2 may be provided, for example, from the controller 520 in FIG. 2. By selectively activating each of the first and second enable signals EN1 and EN2, the one or two data strobe drivers corresponding to the selected data strobe transfer path STP_S among the first and second data strobe drivers SDR1 and SDR2 may be enabled and the rest of the first and second data strobe drivers SDR1 and SDR2 may be disabled.

Figure 12:
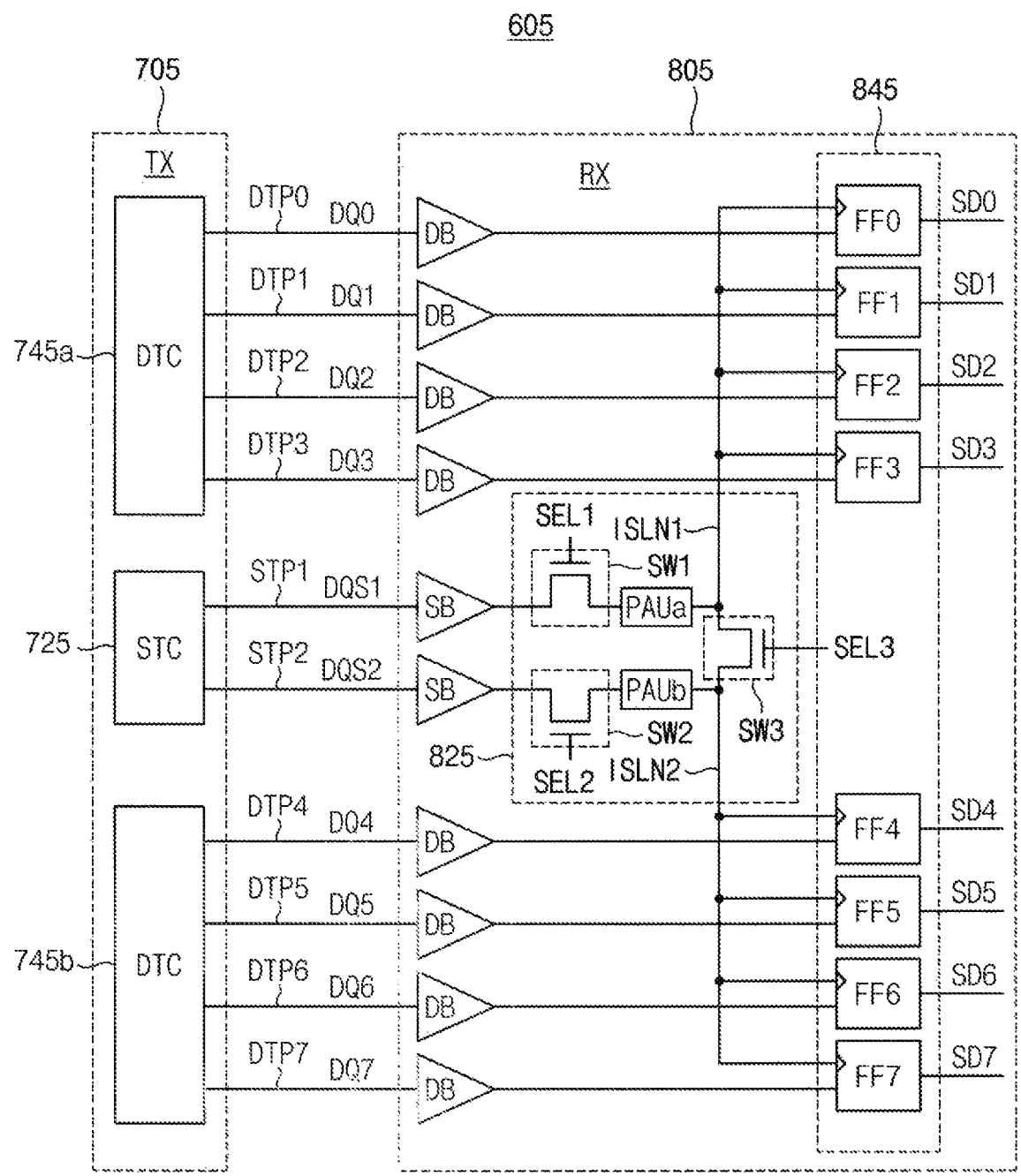
FIG. 12 is a circuit diagram illustrating interface circuitry having phase adjustment function according to example embodiments.

FIG. 12 is a circuit diagram illustrating interface circuitry having phase adjustment function according to example embodiments.

Referring to FIG. 12, interface circuitry 605 of a memory system may include a transmission interface circuit TX 705, a reception interface circuit RX 805, a plurality of data transfer paths DTP0~DTP7, a plurality of data strobe transfer paths STP1 and STP2 and first and second phase adjustment unit circuits PAUa and PAUb. The transmission unit 705 may include a strobe transmission circuit STC 725 and a data transmission circuit DTC 745*a* and 745*b*. The reception circuit 805 may include data reception buffers DB, strobe reception buffers SB, a strobe selection circuit 822, a phase adjustment unit circuit PAU and a sampling circuit 842. The interface circuitry 605 of FIG. 12 is substantially the same as the interface circuitry 604 of FIG. 9 except the phase adjustment unit circuits PAUa and PAUb, and thus the repeated descriptions are omitted.

As illustrated in FIG. 7, the first phase adjustment unit circuit PAUa may be disposed between the first switch circuit SW1 and the first internal strobe supply line ISLN1, and the second phase adjustment unit circuit PAUb may be disposed between the second switch circuit SW2 and the second internal strobe supply line ISLN2. In general, the training process may be performed in the memory system to optimize relative phases or skews between the data strobe signal and the data signals. The result of the training process may be represented by a delay amount of the data strobe signal. The first phase adjustment unit circuit PAUa may include a variable delay circuit configured to delay the first data strobe signal DQS1 provided through the first switch circuit SW1 by a first delay amount to provide the delayed first data strobe signal. The second phase adjustment unit circuit PAUb may include another variable delay circuit configured to delay the second data strobe signal DQS2 provided through the second switch circuit SW2 by a second delay amount to provide the delayed second data strobe signal.

In some example embodiments, each of the phase adjustment unit circuits PAUa and PAUb may include a storage component such as a register to store each of the first and second delay amounts. In some example embodiments, the phase adjustment unit circuits PAUa and PAUb may receive control signals indicating the first and second delay amounts, for example, from the controller 520 in FIG. 2.

Even though not illustrated in figures, it will be understood that the first and second phase adjustment unit circuits PAUa and PAUb in FIG. 12 may be replaced by the plurality of phase adjustment unit circuits PAUs0~PAU7 in FIG. 8.

Figure 13A:
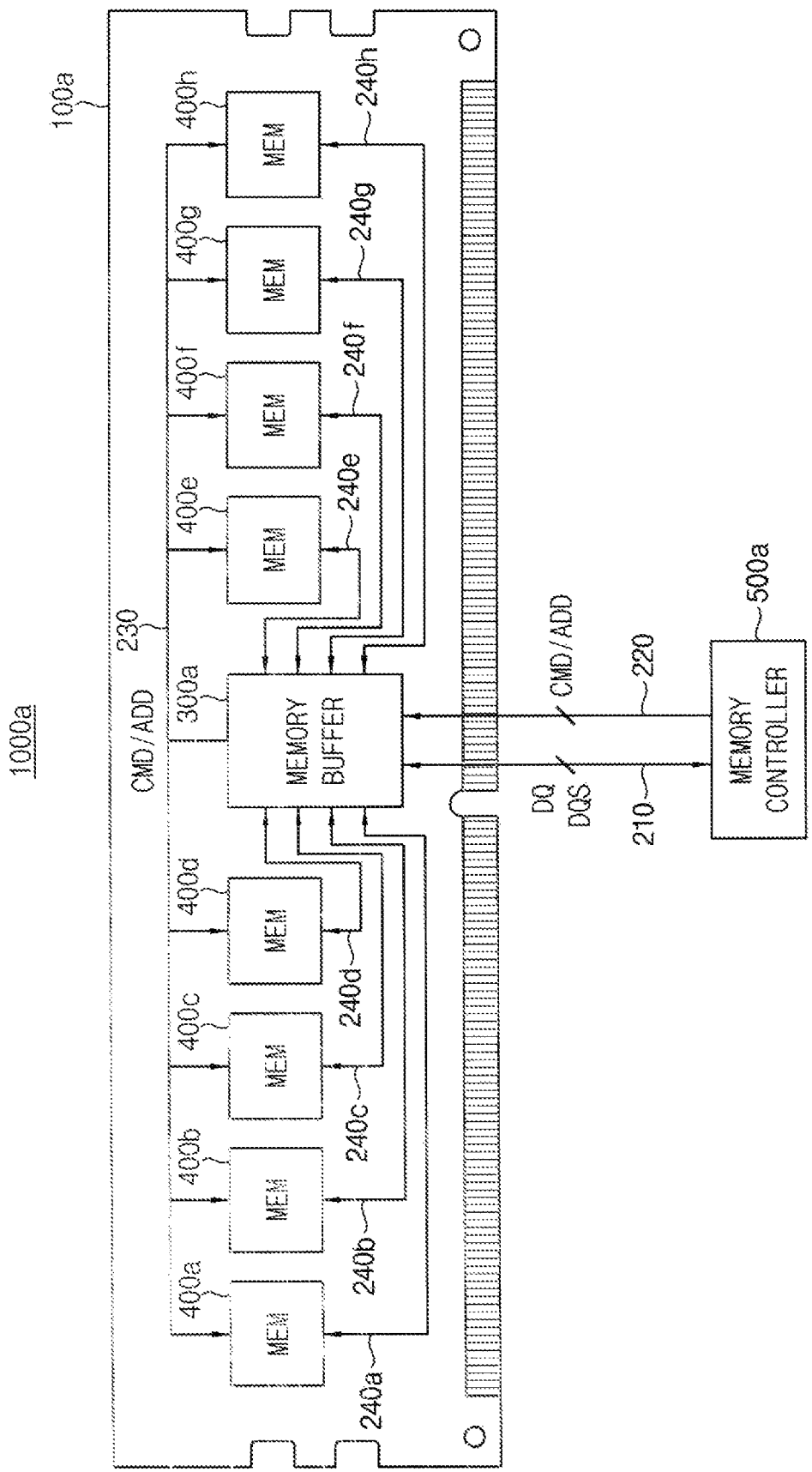
FIGS. 13A, 13B and 13C are diagram illustrating a memory system according to example embodiments.
Figure 13B:
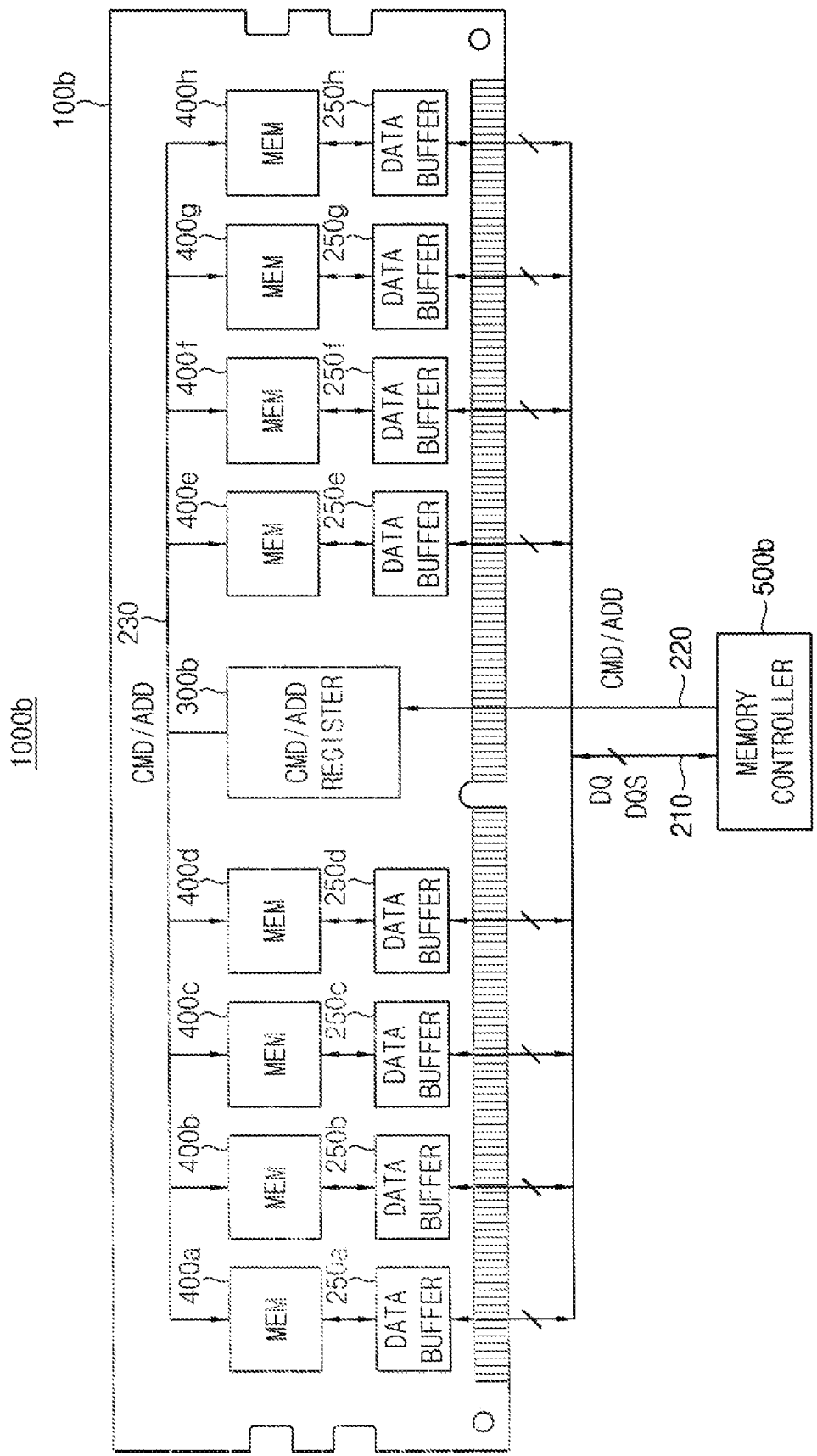
Figure 13C:
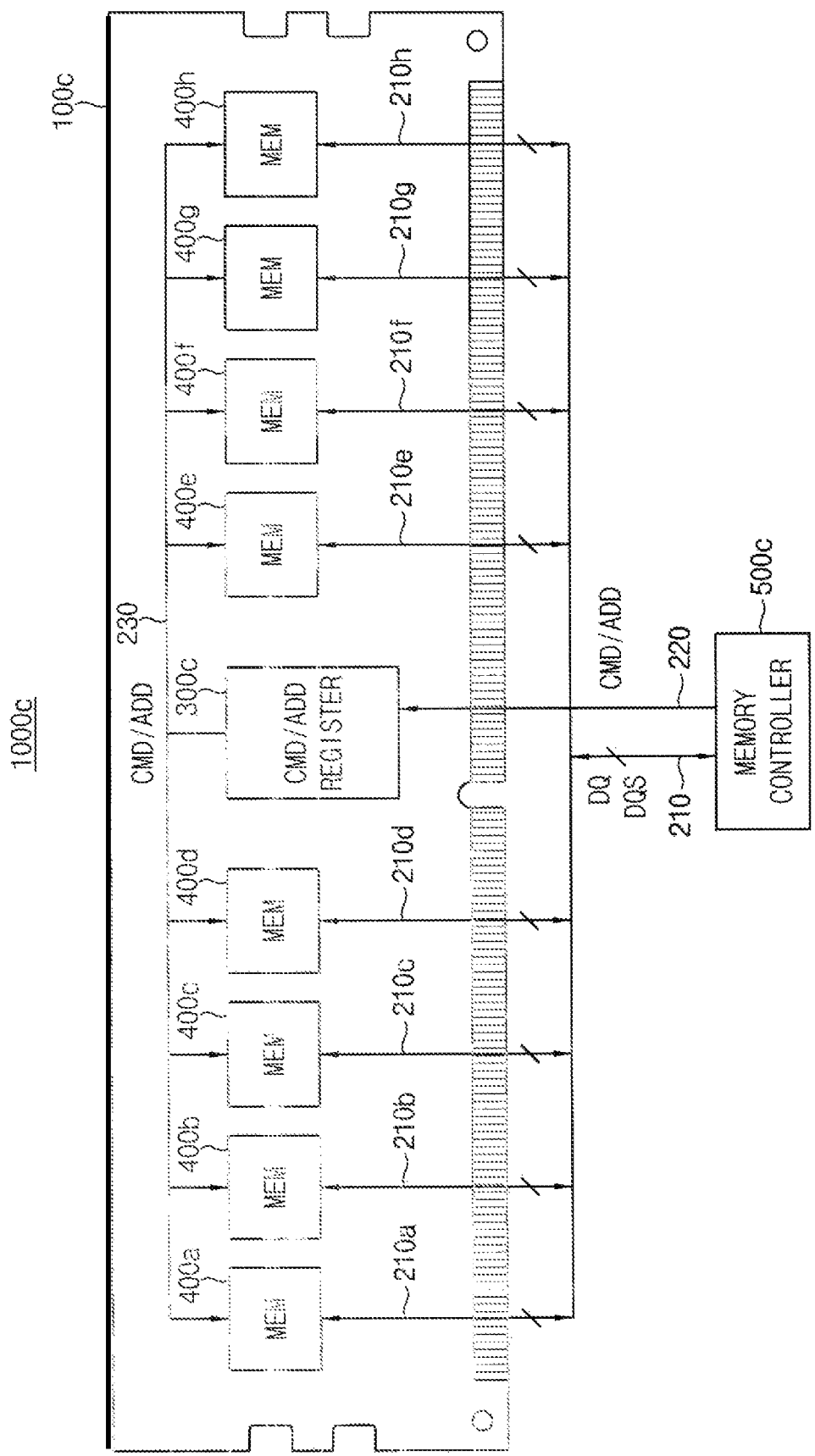

FIGS. 13A, 13B and 13C are diagram illustrating a memory system according to example embodiments.

As illustrated in FIGS. 13A, 13B and 13C, each of memory systems 1000a, 1000b and 1000c may respectively include a memory module 100a, 100b and 100c and a memory controller 500a, 500b and 500c. Each of the memory modules 100a, 100b and 100c may include a module substrate and a plurality of memory chips 400a~400h that are mounted on the module substrate. FIGS. 13A, 13B and 13C illustrate a non-limiting example of eight memory chips 400a~400h, however the number of memory chips included in each memory module may be determined variously.

Referring to FIG. 13A, the memory module 100a may be connected to the memory controller 500a via a data bus 210 and a control bus 220. The memory module 100a may be inserted into a socket connector of a larger memory system or computational system. Electric connectors (or pins) of the memory module 100a may be connected to electric contacts of the socket connector. The electric connectors and the buses 210 and 220 connected to the electric contacts allow direct access to a memory buffer or a buffer chip 300a and indirect access to the memory chips 400a~400h of the memory module 100a. The data bus 210 may comprise signal lines (conductive wiring) to transfer data signals DQ and data strobe signals DQS, and the control bus 220 includes at least one of a command (CMD) line and/or address (ADD) line.

The data bus 210 and control bus 220 are directly connected to the buffer chip 300a via the respective socket/pin and bus signal line arrangements. In turn, the buffer chip 300a is connected to the respective memory chips 400a~400h via at least a commonly-connected first bus 230 and separately connected second buses 240a~240h from specified ports of the buffer chip 300a to corresponding ports of the memory chips 400a~400h. The buffer chip 300a may be used to transfer a received command and/or address received from the memory controller 500a via the control bus 220 to the respective memory chips 400a~400h via the first bus 230.

The buffer chip 300a may transfer write data DQ (i.e., data to be written to one or more of the memory chips 400a~400h) and the data strobe signal DQS received from the memory controller 500a via the data bus 210 to the memory chips 400a~400h via the respective second buses 240a~240h. Alternately, the buffer chip 300a may transfer read data DQ (data retrieved from one or more of the memory chips 400a~400h) obtained from one or more of the memory chips 400a~400h via the second buses 240a~240h to the memory controller 500a via the data bus 210.

The buffer chip 300a may additionally include signal reproduction circuitry and/or signal synchronization circuit, although such circuitry is not shown in FIG. 13A. For example, the buffer chip 300a may include a capacitive separator circuit, a voltage conversion circuit, and signal multiplexing/de-multiplexing block(s).

The buffer chip 300a and the memory controller 500a may each include at least one data input-output unit circuit DIOU according to any of the embodiments described herein (not shown), which is connected through the data bus 210. Each data input-output unit circuit DIOU of the buffer chip 300a and each data input-output unit of the memory controller 500a may be connected using the redundant data strobe scheme according to example embodiments as described above.

Referring to FIG. 13B, a memory module 100b includes a plurality of memory chips 400a~400h, a command (CMD)/address (ADD) register chip 300b, and data buffer chips 250a~250h respectively connected to the memory chips 400a~400h. The CMD/ADD register chip 300b receives command and address information from the memory controller 500b via the control bus 220, then buffers/re-drives the command and address information. The command and address information output from the CMD/ADD register chip 300b is provided to the memory chips 400a~400h via the commonly-connected first bus 230.

The data buffer chips 250a~250h are respectively connected between the memory chips 400a~400h. Each of the data buffer chips 250a~250h is configured to receive and provide the write data signals DQ and the data strobe signal DQS to a corresponding one of the memory chips 400a~400h, as communicated by the memory controller 500b via the data bus 210. In analogous manner, each of the data buffer chips 250a~250h may be used to receive, buffer and transfer read data signal DQ and the data strobe signal DQS retrieved from its corresponding one of the memory chips 400a~400h to the memory controller 500b via the data bus 210.

The data buffer chips 250a~250h and the memory controller 500b may each include at least one data input-output unit circuit DIOU according to any of the embodiments described herein (not shown), which may be connected through the data bus 210. Each data input-output unit circuit DIOU of the data buffer chips 250a~250h and each data input-output unit circuit DIOU of the memory controller 500b may be connected using the redundant data strobe scheme according to example embodiments as described above.

Referring to FIG. 13C, a memory module 100c includes a plurality of memory chips 400a~400h and the CMD/ADD register chip 300c. As described above, the CMD/ADD register chip 300c receives command and address information from the memory controller 500c via the control bus 220, then buffers and re-drives the command and address information. The command and address information provided by the CMD/ADD register chip 300c may be communicated to the respective memory chips 400a~400h via the first bus 230.

Each of the memory chips 400a~400h is connected to the memory controller 500c via a corresponding one of a plurality of data buses 210a~210h, whereby each memory chip is directly wired to the memory controller 500c for receipt and transfer of data signals DQ and data strobe signals DQS. Each of the memory chips 400a~400h may receive the write data signal DQ and the data strobe signal DQS from the memory controller 500c via a corresponding one of the data buses 210a~210h respectively connected to the memory chips 400a~400h, and the read data signal DQ and the data strobe signal DQS retrieved from each of the memory chips 400a~400h may also be transferred to the memory controller 500c via one of the data buses 210a~210h.

The memory chips 400a~400h and the memory controller 500c may each include at least one data input-output unit circuit according to any of the embodiments described herein (not shown), which may be connected through the data bus 210. Each data input-output unit circuit DIOU of the memory chips 400a~400h and each data input-output unit circuit DIOU of the memory controller 500c may be connected using the redundant data strobe scheme according to example embodiments as described above.

Figure 14:
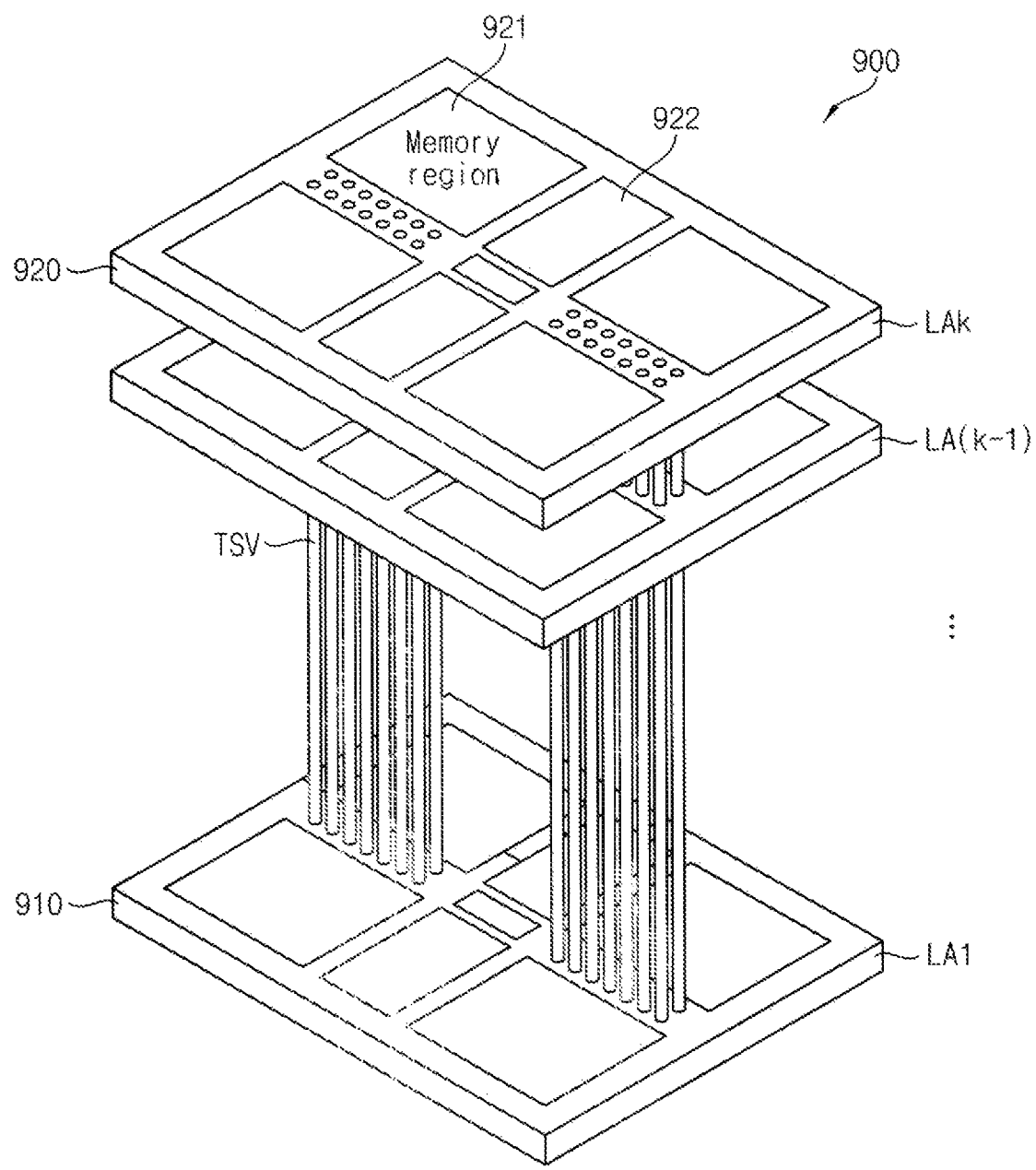
FIG. 14 is a structural diagram illustrating a semiconductor memory device according to example embodiments.

FIG. 14 is a structural diagram illustrating a semiconductor memory device according to example embodiments.

Referring to FIG. 14, a semiconductor memory device 900 may include first through kth semiconductor integrated circuit layers LA1 through LAk (e.g., integrated circuit layer LA1, integrated circuit layer LA2 (not shown), . . . , integrated circuit layer LAk-1, integrated circuit layer LAk, in which the lowest first semiconductor integrated circuit layer LA1 is assumed to be an interface or control chip and the other semiconductor integrated circuit layers LA2 through LAk are assumed to be slave chips including core memory chips. The first through kth semiconductor integrated circuit layers LA1 through LAk may transmit and receive signals between the layers by through-substrate vias TSVs (e.g., through-silicon vias). The lowest first semiconductor integrated circuit layer LA1 as the interface or control chip may communicate with an external memory controller through a conductive structure formed on its external surface.

Each of the first semiconductor integrated circuit layer 910 through the kth semiconductor integrated circuit layer 920 may include memory regions 921 and peripheral circuits 922 for driving the memory regions 921. For example, the peripheral circuits 922 may include a row-driver for driving wordlines of a memory, a column-driver for driving bit lines of the memory, a data input/output circuit for controlling input/output of data, a command buffer for receiving a command from outside and buffering the command, and an address buffer for receiving an address from outside and buffering the address. The data input/output circuits of the first semiconductor integrated circuit layer 910 through the kth semiconductor integrated circuit layer 920 may each comprise at least one data input-output unit circuit DIOU according to any of the embodiments described herein (not shown), Alternatively, only one of the semiconductor integrated circuit layer acting as the interface or control chip (e.g., the lowest first semiconductor integrated circuit layer LA1) may comprise at least one data input-output unit circuit DIOU according to any of the embodiments described herein (e.g., act as the memory buffer 300a as described with respect to FIG. 13A).

The first semiconductor integrated circuit layer 910 may further include a control circuit. The control circuit may control an access to the memory region 921 based on a command and an address signal from a memory controller and may generate control signals for accessing the memory region 921.

Figure 15:
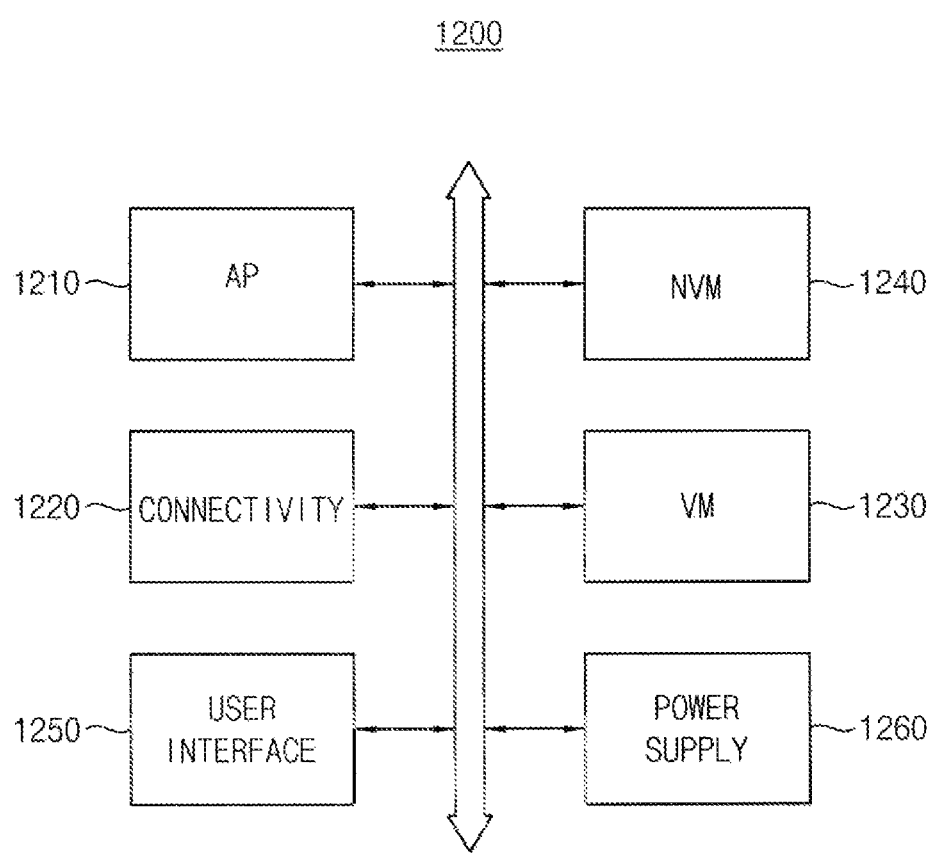
FIG. 15 is a block diagram illustrating a mobile system according to example embodiments.

FIG. 15 is a block diagram illustrating a mobile system according to example embodiments.

Referring to FIG. 15, a mobile system 1200 includes an application processor 1210, a connectivity unit 1220, a volatile memory device (VM) 1230, a nonvolatile memory device 1240, a user interface 1250, and a power supply 1260.

The application processor 1210 may execute applications such as a web browser, a game application, a video player, etc. The connectivity unit 1220 may perform wired or wireless communication with an external device. The volatile memory device 1230 may store data processed by the application processor 1210, or may operate as a working memory. For example, the volatile memory device 1230 may be a dynamic random access memory, such as DDR SDRAM, LPDDR SDRAM, GDDR SDRAM, RDRAM, etc. The nonvolatile memory device 1240 may store a boot image for booting the mobile system 1200 and other data. The user interface 1250 may include at least one input device, such as a keypad, a touch screen, etc., and at least one output device, such as a speaker, a display device, etc. The power supply 1260 may supply a power supply voltage to the mobile system 1200. In some embodiments, the mobile system 1200 may further include a camera image processor (CIP), and/or a storage device, such as a memory card, a solid state drive (SSD), a hard disk drive (HDD), a CD-ROM, etc.

The application processor 1210 and the volatile memory device 1230 may exchange data through the redundant data strobe scheme as described above. In addition, the application processor 1210 and the nonvolatile memory device 1240 may exchange data through the redundant data strobe scheme as described above. Each of the application processor 1210, the volatile memory device 1230 and the nonvolatile memory device 1240 may include at least one data input-output unit circuit DIOU according to any of the embodiments described herein.

As described above, the interface method, the interface circuitry and the memory module according to example embodiments may enhance reliability of data communication through the redundant data strobe scheme by assigning a plurality of data strobe transfer paths to a plurality of data transfer paths such that the plurality of data strobe transfer paths may be shared by the plurality of data transfer paths.

The present inventive concept may be applied to any devices and systems including a memory device. For example, the present inventive concept may be applied to systems such as a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. A method of communicating data within a memory system, the method comprising:
   providing between a memory device and a memory controller a plurality of data strobe transfer paths and a plurality of data transfer paths such that the plurality of data strobe transfer paths may be used by any of the plurality of data transfer paths to provide timing to receive data to be transmitted by the data transfer paths;
   selecting at least one data strobe transfer path among the plurality of data strobe transfer paths; and sampling a plurality of data signals transferred through the plurality of data transfer paths using at least one data strobe signal, the at least one data strobe signal being transferred by the selected at least data strobe transfer path, wherein selecting the at least one data strobe transfer path includes performing defect analysis of at least one of the plurality of data strobe transfer paths and selecting the at least one data strobe transfer path among the plurality of data strobe transfer paths in response to the defect analysis.

2. The method of claim 1,
wherein the defect analysis comprises determining that another data strobe transfer path among the plurality of data strobe transfer paths is defective, and
wherein the at least one data strobe transfer path among the plurality of data strobe transfer paths is selected to replace the defective data strobe transfer path.

3. The method of claim 1, wherein selecting the at least one data strobe transfer path includes:
providing a sequence of the plurality of data strobe transfer paths;
performing the defect analysis by analyzing the next data strobe transfer path in the sequence until a data strobe transfer path of the plurality of data strobe transfer paths is determined not to have failed; and
selecting at least the not-failed data strobe transfer path as the one data strobe transfer path.

4. The method of claim 1, wherein selecting the at least one data strobe transfer path includes:
determining that a first data strobe transfer path among the plurality of data strobe transfer paths is defective;
in response to determining the first data strobe transfer path is defective, determining whether a second data strobe transfer path among the plurality of data strobe transfer paths is defective; and
in response to determining the second data strobe transfer path is not defective, selecting the second data strobe transfer path.

5. The method of claim 1, wherein selecting the at least one data strobe transfer path comprises:
analyzing each of the data strobe transfer paths that may be shared by all of the plurality of data strobe transfer paths; and
selecting the at least one data strobe transfer path among the plurality of data strobe transfer paths based on a result of the analyzing.

6. The method of claim 1, wherein selecting the at least one data strobe transfer path includes:
determining whether a first data strobe transfer path among the plurality of data strobe transfer paths is defective;
then determining whether a second data strobe transfer path among the plurality of data strobe transfer paths is defective; and
selecting both the first and second data strobe transfer paths in response to determining that the first data strobe transfer path is not defective and determining the second data strobe transfer path is not defective.

7. The method of claim 6, further comprising:
sampling a first set of data signals transferred through a first set of data transfer paths among the plurality of the data transfer paths using a first data strobe signal transferred through the first data strobe transfer path; and
sampling a second set of data signals transferred through a second set of data transfer paths among the plurality of the data transfer paths using a second data strobe signal transferred through the second data strobe transfer path.

8. The method of claim 1, further comprising:
driving a common transmission data strobe signal on the plurality of data strobe transfer paths.

9. The method of claim 1, further comprising:
providing a plurality of data strobe drivers configured to drive respective data strobe signals on corresponding ones of the plurality of data strobe transfer paths; and
enabling at least one data strobe driver of the plurality of data strobe drivers, the enabling corresponding to the selected at least one data strobe transfer path, and disabling the remainder of the plurality of data strobe drivers.

10. The method of claim 1, further comprising:
performing a training process using the selected data strobe transfer path to adjust a phase of at least one selected data strobe signal relative to at least one of the plurality of data signals.

11. Interface circuitry of a device of a memory system, the interface circuitry comprising: a plurality of data transfer paths; a plurality of data strobe transfer paths shared by the plurality of data transfer paths; a strobe selection circuit configured to select at least one data strobe transfer path of the plurality of data strobe transfer paths to provide transfer of at least one data strobe signal through the at least one data strobe transfer path; and a plurality of latch circuits configured to sample a plurality of data signals transferred through the plurality of data transfer paths using the at least one data strobe signal, wherein the strobe selection circuit includes an internal strobe supply line connected in common to the plurality of latch circuits and a plurality of switch circuits configured to selectively connect the plurality of data strobe transfer paths to the internal strobe supply line, wherein the strobe selection circuit is configured to perform defect analysis of at least one of the plurality of data strobe transfer paths and select the at least one data strobe transfer path in response to the defect analysis, and wherein each of the plurality of data strobe transfer paths are connected to receive a corresponding data strobe signal from a source external to the device.

12. The interface circuitry of claim 11, wherein the strobe selection circuit is configured to determine the one data strobe transfer path is defective, and in response to determining the one data strobe transfer path is defective, to select another data strobe transfer path among the plurality of data strobe transfer paths to replace the one data strobe transfer path determined to be defective.

13. The interface circuitry of claim 11, wherein the device is a memory device or a memory controller and the interface circuitry is an interface of the memory device or an interface of the memory controller.

14. The interface circuitry of claim 13, wherein the plurality of switch circuits are configured to selectively connect only one of the plurality of data strobe transfer paths to the internal strobe supply line at any one time.

15. The interface circuitry of claim 11, wherein the strobe selection circuit includes:
a first internal strobe supply line connected commonly to a first set of latch circuits among the plurality of latch circuits;
a second internal strobe supply line connected commonly to a second set of latch circuits among the plurality of latch circuits;

a first switch circuit configured to selectively connect a first data strobe transfer path among the plurality of data strobe transfer paths to the first internal strobe supply line;

a second switch circuit configured to selectively connect a second data strobe transfer path among the plurality of data strobe transfer paths to the second internal strobe supply line; and a third switch circuit configured to selectively connect the first internal strobe supply line and the second internal strobe supply line.

16. The interface circuitry of claim 15, wherein the strobe selection circuit is configured to turn on only one of the first switch circuit, the second switch circuit and the third switch circuit upon selecting only one data strobe transfer path among the first and second data strobe transfer paths.

17. The interface circuitry of claim 15, wherein the strobe selection circuit is configured to turn on both the first switch circuit and the second switch circuit and turn off the third switch circuit upon selecting both of the first and second data strobe transfer paths.

18. The interface circuitry of claim 11, further comprising:

a common data strobe driver configured to drive a common transmission data strobe signal on each of the plurality of data strobe transfer paths.

19. The interface circuitry of claim 11, further comprising:

a plurality of data strobe drivers each configured to drive a corresponding data strobe signal on a corresponding one of the plurality of data strobe transfer paths, wherein the strobe selection circuit is configured to enable at least one data strobe driver corresponding to the at least one data strobe transfer path among the plurality of data strobe drivers and disable the remaining ones of the plurality of data strobe drivers.

20. A memory module comprising: a module substrate; a plurality of memory chips mounted on the module substrate, each of the memory chips comprising a plurality of data input-output units configured to perform data transfer with an external device, a plurality of data strobe transfer paths connected to each of the plurality of memory chips and each having a portion formed on the module substrate to communicate a corresponding data strobe signal between the external device and the plurality of memory chips, wherein each data input-output unit of each of the plurality of memory chips comprises: a strobe selection circuit configured to select at least one data strobe transfer path among the plurality of data strobe transfer paths to provide at least one corresponding data strobe signal transferred through the at least one data strobe transfer path, the strobe selection circuit being further configured to perform defect analysis of at least one of the plurality of data strobe transfer paths and select the at least one data strobe transfer path in response to the defect analysis; and a plurality of latch circuits configured to sample a plurality of data signals transferred through a plurality of data transfer paths using the at least one data strobe signal.

* * * * *